United States Patent
Richardson et al.

(10) Patent No.: US 10,044,371 B2
(45) Date of Patent: Aug. 7, 2018

(54) SYSTEMS AND METHODS FOR REPAIR RATE CONTROL FOR LARGE ERASURE CODED DATA STORAGE

(71) Applicant: QUALCOMM Incorporated, San Diego, CA (US)

(72) Inventors: Thomas Joseph Richardson, South Orange, NJ (US); Michael George Luby, Berkeley, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/954,702

(22) Filed: Nov. 30, 2015

(65) Prior Publication Data

US 2017/0063398 A1    Mar. 2, 2017

Related U.S. Application Data

(60) Provisional application No. 62/211,303, filed on Aug. 28, 2015.

(51) Int. Cl.
　　*H03M 13/15*　　(2006.01)
　　*G06F 11/10*　　(2006.01)
　　*G06F 11/00*　　(2006.01)

(52) U.S. Cl.
　　CPC ......... *H03M 13/154* (2013.01); *G06F 11/008* (2013.01); *G06F 11/1076* (2013.01); *G06F 11/1088* (2013.01)

(58) Field of Classification Search
　　CPC .................................................. G06F 11/1076
　　(Continued)

(56) References Cited

U.S. PATENT DOCUMENTS

| | | | | | |
|---|---|---|---|---|---|
| 5,278,839 | A | * | 1/1994 | Matsumoto | G11C 29/835 714/710 |
| 5,596,712 | A | * | 1/1997 | Tsuyama | G06F 11/2257 714/26 |
| 5,677,917 | A | * | 10/1997 | Wheelus | G11C 29/835 714/724 |
| 5,781,721 | A | * | 7/1998 | Hayes | G01R 31/31701 714/42 |

(Continued)

FOREIGN PATENT DOCUMENTS

| CN | 103513942 A | 1/2014 |
|---|---|---|
| CN | 104111880 A | 10/2014 |

(Continued)

OTHER PUBLICATIONS

International Search Report and Written Opinion—PCT/US2016/039606—ISA/EPO—dated Sep. 23, 2016.

*Primary Examiner* — Fritz Alphonse
(74) *Attorney, Agent, or Firm* — Norton Rose Fulbright US LLP

(57) ABSTRACT

Systems and methods which implement repair bandwidth control techniques, such as may provide a feedback control structure for regulating repair bandwidth in the storage system. Embodiments control a source object repair rate in a storage system by analyzing source objects represented in a repair queue to determine repair rate metrics for the source objects and determining a repair rate based on the repair rate metrics to provide a determined level of recovery of source data stored as by the source objects and to provide a determined level of repair efficiency in the storage system. For example, embodiments may determine a per storage object repair rate (e.g., a repair rate preference for each of a plurality of source objects) and select a particular repair rate (e.g., a maximum repair rate) for use by a repair policy. Thereafter, the repair policy of embodiments may implement repair of one or more source objects in accordance with the repair rate.

61 Claims, 11 Drawing Sheets

(58) Field of Classification Search
USPC .................................. 714/764, 766, 768, 6.2
See application file for complete search history.

(56) References Cited

U.S. PATENT DOCUMENTS

| | | | |
|---|---|---|---|
| 5,938,774 A * | 8/1999 | Hsu | ........................... G06F 8/66 |
| | | | 714/10 |
| 7,783,600 B1 | 8/2010 | Spertus et al. | |
| 8,335,966 B1 | 12/2012 | Lary et al. | |
| 8,458,515 B1 | 6/2013 | Saeed | |
| 8,977,804 B1 | 3/2015 | Horn | |
| 9,075,773 B1 | 7/2015 | Rakitzis et al. | |
| 9,098,451 B1 | 8/2015 | Rakitzis et al. | |
| 9,116,833 B1 | 8/2015 | Rakitzis et al. | |
| 9,305,666 B2 | 4/2016 | Rakitzis et al. | |
| 9,626,245 B2 | 4/2017 | Bakre et al. | |
| 2011/0225453 A1 | 9/2011 | Spry et al. | |
| 2012/0017140 A1 | 1/2012 | Wylie et al. | |
| 2012/0023385 A1 | 1/2012 | Scouarnec et al. | |
| 2012/0221920 A1 | 8/2012 | Blaum et al. | |
| 2012/0266044 A1 | 10/2012 | Hu et al. | |
| 2014/0281784 A1 | 9/2014 | Verma et al. | |
| 2014/0317222 A1 | 10/2014 | Li et al. | |
| 2015/0142863 A1 | 5/2015 | Yuen et al. | |
| 2017/0063399 A1 | 3/2017 | Richardson et al. | |

FOREIGN PATENT DOCUMENTS

| | | | |
|---|---|---|---|
| EP | 2365439 A1 | 9/2011 | |
| EP | 2413506 A1 | 2/2012 | |
| EP | 2725491 A1 | 4/2014 | |

\* cited by examiner

SYSTEMS AND METHODS FOR REPAIR RATE CONTROL FOR LARGE ERASURE CODED DATA STORAGE

CROSS-REFERENCE TO RELATED APPLICATIONS

This application claims the benefit of U.S. Provisional Patent Application No. 62/211,303, entitled, "SYSTEMS AND METHODS FOR REPAIR RATE CONTROL FOR LARGE ERASURE CODED DATA STORAGE", filed on Aug. 28, 2015, which is expressly incorporated by reference herein in its entirety

DESCRIPTION OF THE RELATED ART

The creation, management, storage, and retrieval of electronic data has become nearly ubiquitous in the day-to-day world. Such electronic data may comprise various forms of information, such as raw data (e.g., data collected from sensors, monitoring devices, control systems, etc.), processed data (e.g., metrics or other results generated from raw data, data aggregations, filtered data, etc.), produced content (e.g., program code, documents, photographs, video, audio, etc.), and/or the like. Such data may be generated by various automated systems (e.g., network monitors, vehicle on-board computer systems, automated control systems, etc.), by user devices (e.g., smart phones, personal digital assistants, personal computers, digital cameras, tablet devices, etc.), and/or a number of other devices.

Regardless of the particular source or type of data, large quantities of electronic data are generated, stored, and accessed every day. Accordingly sophisticated storage systems, such as network attached storage (NAS), storage area networks (SANs), and cloud based storage (e.g., Internet area network (IAN) storage systems), have been developed to provide storage of large amounts of electronic data. Such storage systems provide a configuration in which a plurality of storage nodes are used to store the electronic data of one or more users/devices, and which may be stored and retrieved via one or more access servers.

FIG. 1A shows an exemplary implementation of storage system 100A in which access server 110 is in communication with end user (EU) device 120 to provide storage services with respect thereto. Access server 110 may comprise one or more servers operable under control of an instruction set to receive data from devices such as EU device 120, and to control storage of the data and to retrieve data in response to requests from devices such as EU device 120. Accordingly, access server 110 is further in communication with a plurality, M, of storage nodes (shown here as storage nodes 130-1 through 130-M). Storage nodes 130-1 through 130-M may comprise a homogeneous or heterogeneous collection or array (e.g., redundant array of independent disks (RAID) array) of storage media (e.g., hard disk drives, optical disk drives, solid state drives, random access memory (RAM), flash memory, etc.) providing persistent memory in which the electronic data is stored by and accessible through access server 110. Each such storage node may be, for example, a commodity web server. Alternatively, in some deployments at least some storage nodes may be personal devices interconnected over the Internet. EU device 120 may comprise any configuration of device that operates to generate, manage, and/or access electronic data. It should be appreciated that although only a single such device is shown, storage system 100A may operate to serve a plurality of devices, some or all of which may comprise devices in addition to or in the alternative to devices characterized as "end user" devices.

FIG. 1B shows an exemplary implementation of storage system 100B in which access servers 110-1 through 110-14 may communicate with one or more EU devices of EU devices 120-1 through 120-3 to provide storage services with respect thereto. It should be appreciated that storage system 100B shows an alternative configuration to that of 100A discussed above wherein, although the access servers, EU devices, and storage nodes may be embodied as described above, the storage nodes of storage system 110B are deployed in a cluster configuration, shown as storage node cluster 130. In operation of storage system 100B, a cluster of access servers have access to the cluster of storage nodes. Thus, the EU devices may connect in a variety of ways to various access servers to obtain data services. In some cases, the access servers may be distributed around the country such that no matter where the EU device is located it may access the data stored in the storage node cluster. Storage nodes of such a configuration may be distributed geographically as well.

Source blocks of electronic data are typically stored in storage systems such as storage systems 100A and 100B as objects. Such source blocks, and thus the corresponding objects stored by the storage systems, may comprise individual files, collections of files, data volumes, data aggregations, etc. and may be quite large (e.g., on the order of megabytes, gigabytes, terabytes, etc.). The objects are often partitioned into smaller blocks, referred to as fragments (e.g., a fragment typically consisting of a single symbol), for storage in the storage system. For example, an object may be partitioned into k equal-sized fragments (i.e., the fragments comprise blocks of contiguous bytes from the source data) for storage in storage systems 100A and 100B. Each of the k fragments may, for example, be stored on a different one of the storage nodes.

In operation, storage systems such as storage systems 100A and 100B are to provide storage of and access to electronic data in a reliable and efficient manner. For example, in a data write operation, access server 110 may operate to accept data from EU device 120, create objects from the data, create fragments from the objects, and write the fragments to some subset of the storage nodes. Correspondingly, in a data read operation, access server 110 may receive a request from EU device 120 for a portion of stored data, read appropriate portions of fragments stored on the subset of storage nodes, recreate the object or appropriate portion thereof, extract the requested portion of data, and provide that extracted data to EU device 120. However, the individual storage nodes are somewhat unreliable in that they can intermittently fail, in which case the data stored on them is temporarily unavailable, or permanently fail, in which case the data stored on them is permanently lost (e.g., as represented by the failure of storage node 130-2 in FIG. 1C).

Erasure codes (e.g., tornado codes, low-density parity-check codes, Reed-Solomon coding, and maximum distance separable (MDS) codes) have been used to protect source data against loss when storage nodes fail. When using an erasure code, such as MDS erasure codes, erasure encoding is applied to each source fragment (i.e., the k fragments into which an object is partitioned) of an object to generate repair data for that fragment, wherein the resulting repair fragments are of equal size with the source fragments. In operation of the storage system, the source fragments and corresponding repair fragments are each stored on a different one of the storage nodes.

The erasure code may provide r repair fragments for each source object, whereby the total number of fragments, n, for a source object may be expressed as n=k+r. Thus, the erasure code may be parameterized as (n; k; r) where k is the number of source symbols in a source block, n is the total number of encoded symbols, and r=n−k is the number of repair symbols. A property of MDS erasure codes is that all k source symbols can be recovered from any k of the n encoded symbols (i.e., the electronic data of the source block may be retrieved by retrieving any combination (source and/or repair fragments) of k fragments. Although providing data reliability, it should be appreciated that where desired data is not directly available (e.g., a fragment is unavailable due to a failed storage node), to recreate the missing data k fragments must be accessed to recreate the missing data (i.e., k times the amount of data must be accessed to recreate the desired but missing data). This can result in inefficiencies with respect to the use of resources, such as communication bandwidth, computing resources, etc.

In providing reliable storage of the electronic data, storage systems such as storage systems 100A and 100B implementing erasure coding of the data (e.g., access server 110 of FIG. 1C operational to provide repair server functionality) have a repair process or policy running in the background to determine the number of fragments available with respect to the objects (e.g., to detect objects which are missing one or more fragments, such as due to a failed storage node). For objects with some level of missing fragments (e.g., as the number of available fragments approaches k) logic of the storage system repair process will read k remaining fragments for that object and recreate the object and write additional fragments to the storage system (e.g., on other of the storage nodes which remain available). Typically, the objects for which the fewest fragments are available are the ones that are repaired first, before objects that have more fragments available (assuming an equal number of fragments for the objects), according to such repair policies.

It should be appreciated that, although the example of FIG. 1C illustrates a repair server as being implemented by access server 110, repair servers operable to provide repair services herein may be provided in various configurations. For example, one or more repair servers may be provided separately from access servers of a storage system according to embodiments. As another example, repair servers and or access servers may be implemented by storage nodes 130-1 through 130-M.

The aforementioned intermittent node failures are far more typical than permanent node failures (e.g., 90% of the node failures are intermittent), and the repair policy is not needed to recover the data that is temporarily unavailable on these nodes as eventually this data will become available again when the node comes back online. Accordingly, when fragments become unavailable the repair process may detect and delay repairing the data for some period of time, T (e.g., intermittent failure threshold time), to determine whether the failure is intermittent or permanent.

The erasure code solutions that have been implemented with respect to storage systems have been small erasure code solutions due to their suitability for relatively rapid recreation of missing source data. An (n; k; r) erasure code solution is said to be a small erasure code solution if n<<M (i.e., for each source object there are fragments at a small fraction of the storage nodes). Such a small erasure code configuration (e.g., k=10) generally comprises a correspondingly small number of repair fragments (e.g., r=4, thus n=14). Accordingly, for a small erasure code solution it is beneficial to use a reactive repair policy (i.e., when a fragment of an object is lost due to a permanent node failure then the repair policy immediately or as quickly as possible replaces the lost fragment with another fragment in light of the total number of fragments, n, being so near the minimum number of fragments, k, needed to recover the data). Because a large amount of data is stored on each node (typically many terabytes), and all data comprising fragments stored on a node typically needs to be replaced when the node permanently fails, the repair process reads and writes a large amount of data after a node permanently fails. This reading and writing of large amounts of data generally results in the consumption of large amounts of bandwidth in the storage system by the repair policy and, when coupled with a reactive repair policy, can result in disruptive spikes in storage system bandwidth utilization (e.g., delaying or preventing primary data access services by the storage system). That is, the repair policy implemented with respect to a small erasure code configuration may act somewhat erratically whereby it utilizes a large amount of bandwidth for periods of time when attempting to repair data immediately upon determining fragments are unavailable due to a permanently failed node, whereas at other periods of time the repair policy may utilize no bandwidth. Furthermore, the repair process may not be able to repair fragments fast enough before further node failures lead to permanent loss of object data if not enough bandwidth is allocated to the repair process.

SUMMARY

A method, implemented by processor-based logic of a storage system in which source objects are stored as a plurality of erasure coded fragments, for controlling a source object repair rate in the storage system is provided according to embodiments herein. The method of embodiments includes analyzing a plurality of source objects represented in a repair queue to determine at least one repair rate metric for source objects of the plurality of source objects. Embodiments of the method further include determining a repair rate based on the at least one repair rate metric for the source objects of the plurality of source objects to provide a determined level of recovery of source data stored by the plurality of source objects and to provide a determined level of repair efficiency in the storage system, and implementing repair of one or more source objects of the plurality of source objects in accordance with the repair rate.

An apparatus for controlling a source object repair rate in a storage system is provided according to further embodiments herein. The apparatus of embodiments includes one or more data processors and one or more non-transitory computer-readable storage media containing program code configured to cause the one or more data processors to perform certain operations. The operations performed according to embodiments include analyzing a plurality of source objects represented in a repair queue to determine at least one repair rate metric for the source objects of the plurality of source objects. The operations performed according to embodiments further include determining a first repair rate based on the at least one repair rate metric for the source objects of the plurality of source objects to provide a determined level of recovery of source data stored by the plurality of source objects and to provide a determined level of repair efficiency in the storage system, and implementing repair of one or more source objects of the plurality of source objects in accordance with the first repair rate.

An apparatus for controlling a source object repair rate in a storage system is provided according to still further embodiments herein. The apparatus of embodiments includes means for analyzing a plurality of source objects represented in a repair queue to determine at least one repair rate metric for the source objects of the plurality of source objects. The apparatus of embodiments further includes means for determining a first repair rate based on the at least one repair rate metric for the source objects of the plurality of source objects to provide a determined level of recovery of source data stored by the plurality of source objects and to provide a determined level of repair efficiency in the storage system, and means for implementing repair of one or more source objects of the plurality of source objects in accordance with the first repair rate.

A non-transitory computer-readable medium comprising codes for controlling a source object repair rate in a storage system is provided according to yet further embodiments herein. The codes of embodiments cause a computer to analyze a plurality of source objects represented in a repair queue to determine at least one repair rate metric for the source objects of the plurality of source objects. The codes of embodiments further cause a computer to determine a first repair rate based on the at least one repair rate metric for the source objects of the plurality of source objects to provide a determined level of recovery of source data stored by the plurality of source objects and to provide a determined level of repair efficiency in the storage system, and implement repair of one or more source objects of the plurality of source objects in accordance with the first repair rate.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1A:
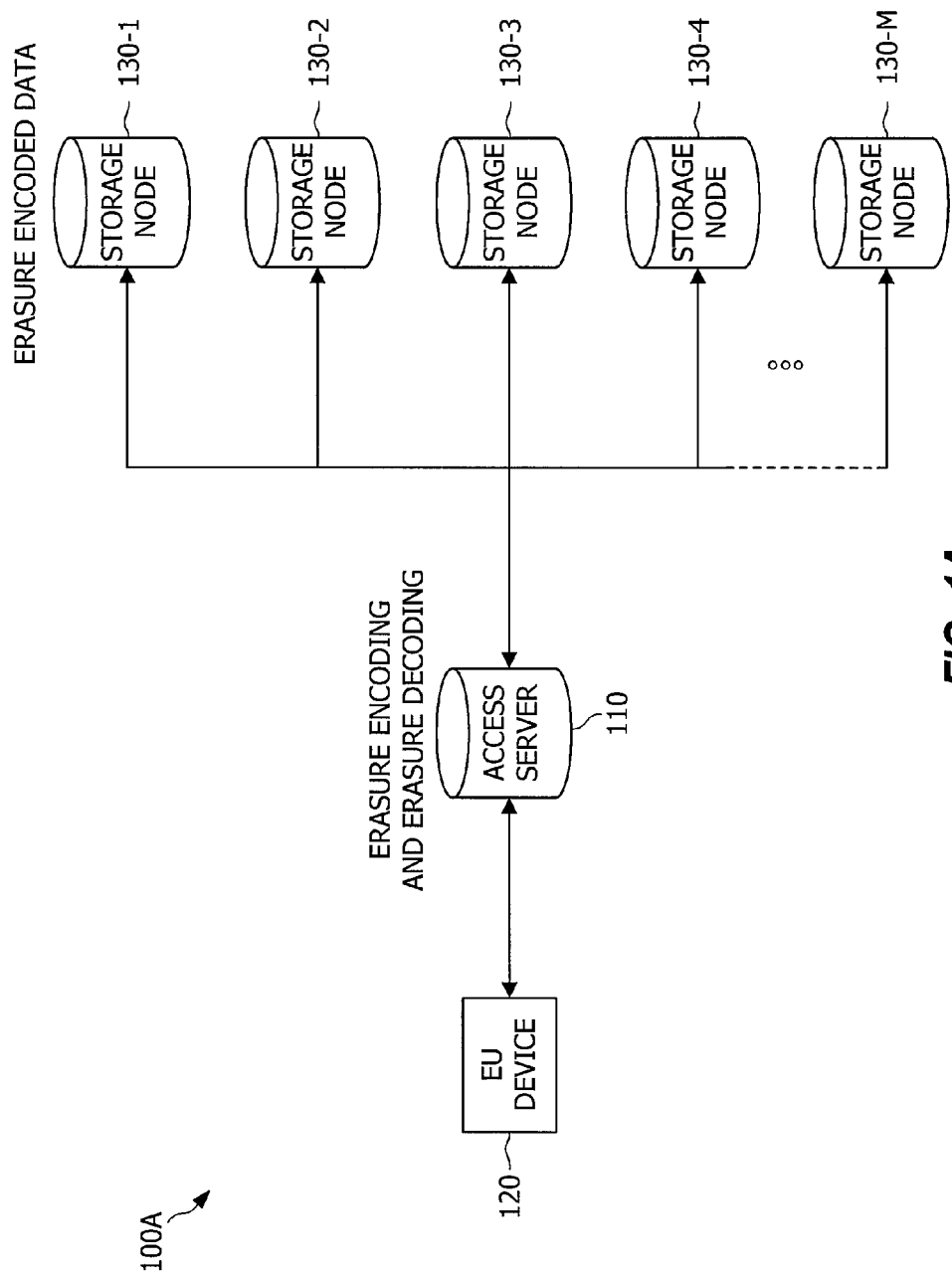
FIGS. 1A and 1B show exemplary implementations of storage systems as may be adapted to provide repair bandwidth control according to embodiments of the present disclosure.
Figure 1B:
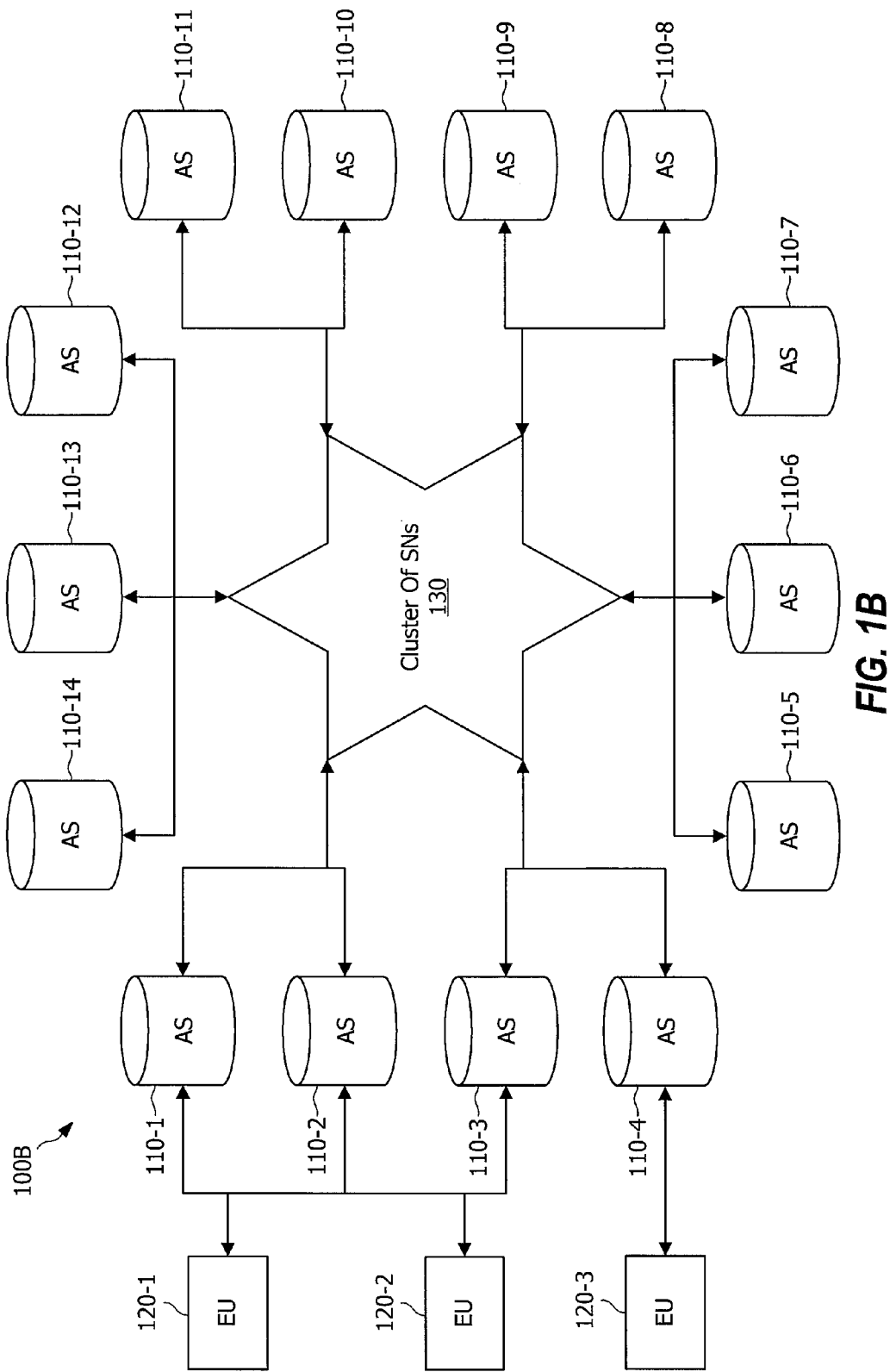
Figure 1C:
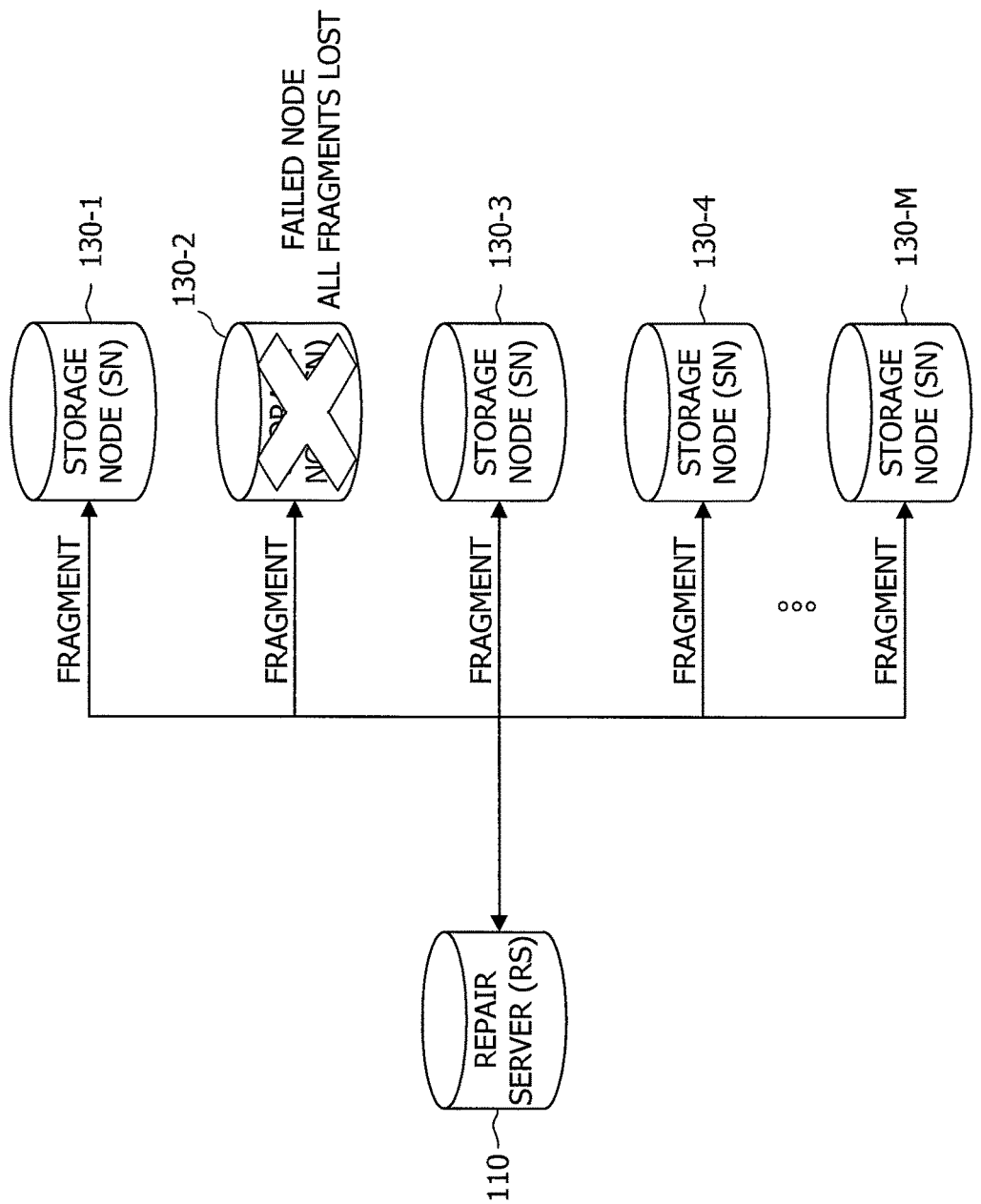
FIG. 1C shows failure of a storage node as may be experienced in the storage systems of FIGS. 1A and 1B.

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

As used in this description, the terms "data" and "electronic data" may include information and content of various forms, including raw data, processed data, produced content, and/or the like, whether being executable or non-executable in nature. Such data may, for example, include data collected from sensors, monitoring devices, control systems, metrics or other results generated from raw data, data aggregations, filtered data, program code, documents, photographs, video, audio, etc. as may be generated by various automated systems, by user devices, and/or other devices.

As used in this description, the term "fragment" refers to one or more portions of content that may be stored at a storage node. For example, the data of a source object may be partitioned into a plurality of source fragments, wherein such source objects may comprise an arbitrary portion of source data, such as a block of data or any other unit of data including but not limited to individual files, collections of files, data volumes, data aggregations, etc. The plurality of source fragments may be erasure encoded to generate one or more corresponding repair fragments, whereby the repair fragment comprises redundant data with respect to the source fragments. The unit of data that is erasure encoded/decoded is a source block, wherein k is the number of source symbols per source block, Bsize is the source block size, Ssize is the symbol size (Bsize=k·Ssize), n is the number of encoded symbols generated and stored per source block, and r is the number of repair symbols (r=n−k), and wherein the symbol is the atomic unit of data for erasure encoding/decoding. Although the symbol size (Ssize) may be different for different source blocks, the symbol size generally remains the same for all symbols within a source block. Similarly, although the number of source symbols (k), the number of repair symbols (r), and the number of encoded symbols generated may be different for different source blocks, the values generally remain the same for all source blocks of a particular object. Osize is the size of the source object and Fsize is the size of the fragment (e.g., where k is both the number of source symbols per source block and the number of fragments per source object, Osize=k·Fsize).

As used in this description, the terms "component," "database," "module," "system," "logic" and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

As used herein, the terms "user equipment," "user device," "end user device," and "client device" include devices capable of requesting and receiving content from a web server or other type of server and transmitting information to a web server or other type of server. In some cases, the "user equipment," "user device," "end user device," or "client device" may be equipped with logic that allows it to read portions or all of fragments from the storage nodes to recover portions or all of source objects. Such devices can be a stationary devices or mobile devices. The terms "user equipment," "user device," "end user device," and "client device" can be used interchangeably.

As used herein, the term "user" refers to an individual receiving content on a user device or on a client device and transmitting information to or receiving information from a website or other storage infrastructure.

Embodiments according to the concepts of the present disclosure provide solutions with respect to storing and accessing source data in a reliable and efficient manner within a storage system of unreliable nodes (i.e., nodes that can store data but that can intermittently fail, in which case the data stored on them is temporarily unavailable, or permanently fail, in which case the data stored on them is permanently lost). In particular, embodiments herein provide methodologies, as may be implemented in various configurations of systems and methods, for reliably storing data and/or facilitating access to data within a storage system using fragment encoding techniques other than Maximum Distance Separable (MDS) codes, such as may utilize large erasure codes (e.g., RAPTOR Forward Error Correction (FEC) code as specified in IETF RFC 5053, and RAPTORQ Forward Error Correction (FEC) code as specified in IETF RFC 6330, of which software implementations are available from Qualcomm Incorporated). Although, large erasure codes have generally not been considered with respect to solutions for reliably and efficiently storing and accessing source data within a storage system of unreliable nodes due to potential demands on repair bandwidth and potential inefficient access when the desired data is not directly available, embodiments described in U.S. patent application Ser. Nos. 14/567,203, 14/567,249, and 14/567,303, each entitled "SYSTEMS AND METHODS FOR RELIABLY STORING DATA USING LIQUID DISTRIBUTED STORAGE," each filed Dec. 11, 2014, the disclosures of which are hereby incorporated herein by reference, utilize a lazy repair policy (e.g., rather than a reactive, rapid repair policy as typically implemented by systems implementing a short erasure code technique) to control the bandwidth utilized for data repair processing within the storage system. The large erasure code storage control of embodiments operates to compress repair bandwidth (i.e., the bandwidth utilized within a storage system for data repair processing) to the point of operating in a liquid regime (i.e., a queue of items needing repair builds up and the items are repaired as a flow), thereby providing large erasure code storage control in accordance with concepts herein.

In some embodiments, repair can be executed in such a way that if a first object has less available fragments than a second object, then the set of ESIs associated with the available fragments for the first object is a subset of the set of ESIs associated with the available fragments for the second object, i.e., all the available fragments for the first object are in common with the available fragments for the second object, in which case the available fragments for the first source object are referred to herein as commonly available for the first and second source objects. In this case, if an object with the least number of available fragments is decodable (recoverable) then all other objects are decodable (recoverable), and thus decodability of all the objects can be verified by verifying that decoding is possible from the (unique) set of ESIs associated with an object with the least number of available fragments, since all of the fragments available for an object with the least number of available fragments are common to the set of available fragments for any other object. More generally stated, a set of fragments is commonly available for a set of one or more source objects if each fragment in the set of fragments (e.g., as identified by its ESI) is available for each source object in the set of source objects. Thus verifying decodability with respect to a set of commonly available fragments (e.g., based on their ESIs) can be used to verify decodability of all source objects in the set of source objects.

It should be appreciated that there are various metrics by which to evaluate a storage system solution. Such metrics include reliability, storage efficiency, repair bandwidth efficiency, repair efficiency, and access efficiency.

Reliability provides a measure of the amount of time that all source data can be stored without loss of any of the data. Reliability is usually measured as a mean time to source data loss, and typically measured in years. The reliability metric used in accordance with some embodiments herein is the mean time to loss of any source data, or mean time to data loss (MTTDL). MTTDL is sometimes estimated, for example, by calculating a mean time to loss of a particular piece of source data and multiplying that metric by the number of pieces of source data in the storage system. However, the accuracy of this estimate method relies upon the assumption that each piece of source data is lost independently of other pieces, and this assumption may not be true for some systems.

Storage efficiency provides a measure of the fraction of the available storage within the storage system that can be used to store source data. Storage efficiency ($\alpha$) measures the ratio of the total size of source objects in the system to the total target amount of data used to store the source objects, and the storage overhead or storage redundancy ($\beta$) is 1-$\alpha$. That is, storage overhead or storage redundancy is the ratio of the total target amount of repair data for all objects divided by the total target amount of source and repair data for all objects in the storage system when using a systematic erasure code to store the objects. Thus, the storage overhead is the target fraction of the used storage that is not for source data. The storage efficiency ($\alpha$), being the target fraction of storage usable for source data, may thus be represented in terms of the storage overhead as $\alpha=1-\beta$.

Repair bandwidth efficiency provides a measure of the amount of network bandwidth used for repairing lost data from failed storage nodes. It should be appreciated that repair bandwidth may be a shared resource with the access bandwidth and/or storage bandwidth (e.g., each taken from the available data communication bandwidth). Accordingly, an upper bound on the repair bandwidth (R) may be provided according to embodiments herein.

Repair efficiency provides a measure of the amount of data which is needed to be read for a resulting amount of repair data generated. Accordingly, repair efficiency may be measured by the ratio of the number of fragments that need to be read to decode the source data to the number of fragments that are generated for the repair. Thus, the larger the number of fragments generated for a particular source object by the repair process, the higher the repair efficiency.

Access efficiency provides a measure of the amount of data that needs to be read from the storage system to retrieve a given portion of source data (e.g., f (A) is the amount of read data from the storage nodes to access A bytes of source data, wherein when f(A) is greater than A the data access is inefficient). It should be appreciated that the amount of time to access source data is related to the access efficiency. Accordingly, when the amount of data read from the storage nodes to access a particular portion of source data is larger than that portion of source data, not only is more bandwidth than minimally necessary used to access the data but the amount of time it takes to access the source data can be longer than minimally necessary. Accordingly, embodiments herein are adapted to provide implementations wherein very nearly f (A)=A.

Permanent failure of the nodes is often modeled by a Poisson process parameterized by $\lambda$, which denotes the failure rate of each node according to an exponential distribution. There are also intermittent failures of nodes (e.g., a node that is not available for some small interval of time but which comes back online and is fully available again). As previously mentioned, such intermittent node failures are far more typical than permanent node failures. Accordingly, a repair policy is not needed to recover the data temporarily unavailable on these nodes as eventually this data will become available again when the node comes back online and thus when nodes fail there is some period of time, as may be denoted by an intermittent failure threshold, T, until it is determined whether the failure is intermittent or permanent. Nodes can be added to the storage system to replace nodes that have failed permanently. When replacement nodes are available for permanently failed nodes, the repair policy can repair an object that has lost fragments on failed nodes by reading fragments for the object from other nodes, erasure decode the object from the read fragments, erasure encode additional fragments from the object, and store these additional fragments on replacement nodes.

The repair bandwidth metric, R, utilized according to some embodiments of the present disclosure is an amount of bandwidth provisioned to be used by the repair policy to ensure a provided MTTDL, whereby the repair policy may use this amount of repair bandwidth at each point in time, or more generally the repair policy may use this amount of repair bandwidth when averaged over a longer window of time. The repair bandwidth provisioned to the repair process may be respected on an instantaneous basis (i.e., the repair process may use repair bandwidth at a steady rate that is at or below the provisioned repair bandwidth). Alternatively, the repair bandwidth provisioned to the repair process may be considered as an average over a long window of time that is sufficient for the repair process to achieve a provisioned MTTDL, and thus the repair process may decide to use the repair bandwidth in, for example, a scheduled manner independent of the timing of storage node failures. For example, the repair process may be scheduled to run periodically for an hour or two each day, for a few hours each week, or for a few hours each month or couple of months, such that the average repair bandwidth used by the repair process over these windows of times averages to the provisioned repair bandwidth.

The repair policy may use such a provisioned repair bandwidth in a way that avoids interference with other processes sharing the same bandwidth resources, such as an access process that is accessing data stored on the storage nodes, or a storage process that is storing data to the storage nodes. For example, the repair policy may detect that another process needs to use a significant part of the shared bandwidth for some period of time, and the repair process may suspend or significantly slow down its usage of repair bandwidth during this period of time and then use more repair bandwidth again after the other processes bandwidth needs have reduced. In this example, the repair policy is essentially running as a background process with respect to bandwidth consumption (e.g., the repair policy backs off on its usage of bandwidth in response to other processes increased bandwidth usage). As another example, the repair policy may have scheduled times when it uses repair bandwidth, and refrain from using repair bandwidth at other times, wherein the scheduled times of repair bandwidth usage are for example times when other processes that share the bandwidth resources are typically quiescent (e.g., the repair process uses repair bandwidth from 1 A.M. to 3 A.M. each morning when there is very little access or storage activity within the storage system). In these cases, the usage of repair bandwidth by the repair server is largely independent of the timing of data loss within the storage system (e.g., the timing of permanent or intermittent storage node failures).

The access efficiency metric may be considered with respect to a plurality of situations. For example, the access efficiency metric may be considered with respect to the case where there are no node failures (intermittent or permanent) amongst the storage nodes that are used to store the source data, and the case where there are node failures (intermittent or permanent) amongst the storage nodes that are used to store the source data. The amount of data read from storage nodes in order to access a chunk of source data is an important component of access efficiency because this largely determines the speed at which a chunk can be accessed. Ideally, the amount of data read to access a chunk should be equal to the size of the chunk.

Previous solutions for storing and accessing source data within a storage system have primarily focused on using a reactive repair policy with respect to data determined to be unavailable. In operation according to such reactive repair policies, data is scheduled for repair as soon as any data is lost on a permanently failed node, and as much bandwidth as necessary is used to perform the repair in a burst. A Markov chain analysis is typically applied to individual objects in the storage system for the reliability analysis of a reactive repair policy. The analysis assumes that the number of objects that need repair is always nearly zero, which is justified if the repair policy can always work quickly enough.

With a reactive repair policy, the overall amount of repair traffic generated is proportional to at least k+1 times the amount of data lost on permanently failed nodes, where k is the number of source symbols used by the erasure code. This is because each time a fragment of an object is lost on a permanently failed node, at least k fragments for that object are read by the repair policy to generate at least one repair fragment that is stored on replacement nodes. Some effort has been made to reduce k through the use of locally repairable codes. Such reduction, however, comes at the cost of worst case recoverability properties of the code or additional storage overhead.

Large erasure code solutions in combination with a lazy repair policy achieve better trade-offs in storage efficiency, repair bandwidth efficiency, and reliability than is possible for any small erasure code solution. In particular, the use of a large erasure code according to embodiments provides a number of advantages, such as advantages associated with spreading the data for a particular object over many nodes and providing improved repair and access properties. Such large erasure codes that are not inherently MDS cannot, however, guarantee code performance. That is, although large erasure codes provide very high data recovery reliability of a source object from k fragments (e.g., in the range of 99%), recovery is nevertheless not guaranteed. The use of some additional number of fragments, x, increases recovery reliability (e.g., source object data recovery using k+x fragments, where x=1 provides data recovery in the range of 99.99% and where x=2 provides data recovery in the range of 99.9999%). However, no amount, x, of additional fragments is provably sufficient to guarantee recovery of the source data. Nevertheless, embodiments utilizing large erasure codes provide smoothness and efficiency of repair bandwidth, wherein efficiency may arise from an overhead operating point implemented and diminishing efficiency returns may be realized from operating near k available fragments. Additionally, embodiments realize improved accessibility through operating with a minimum redundancy, Y, (e.g., a minimum number of available redundancy fragments) providing network and device multiplexing gains on latency, wherein accessibility is benefited from a larger number of available redundancy fragments. Moreover, the large erasure codes utilized according to embodiments provides good, albeit probabilistic, data recovery performance along with superior encoding and decoding performance (as compared to small erasure codes).

Figure 2A:
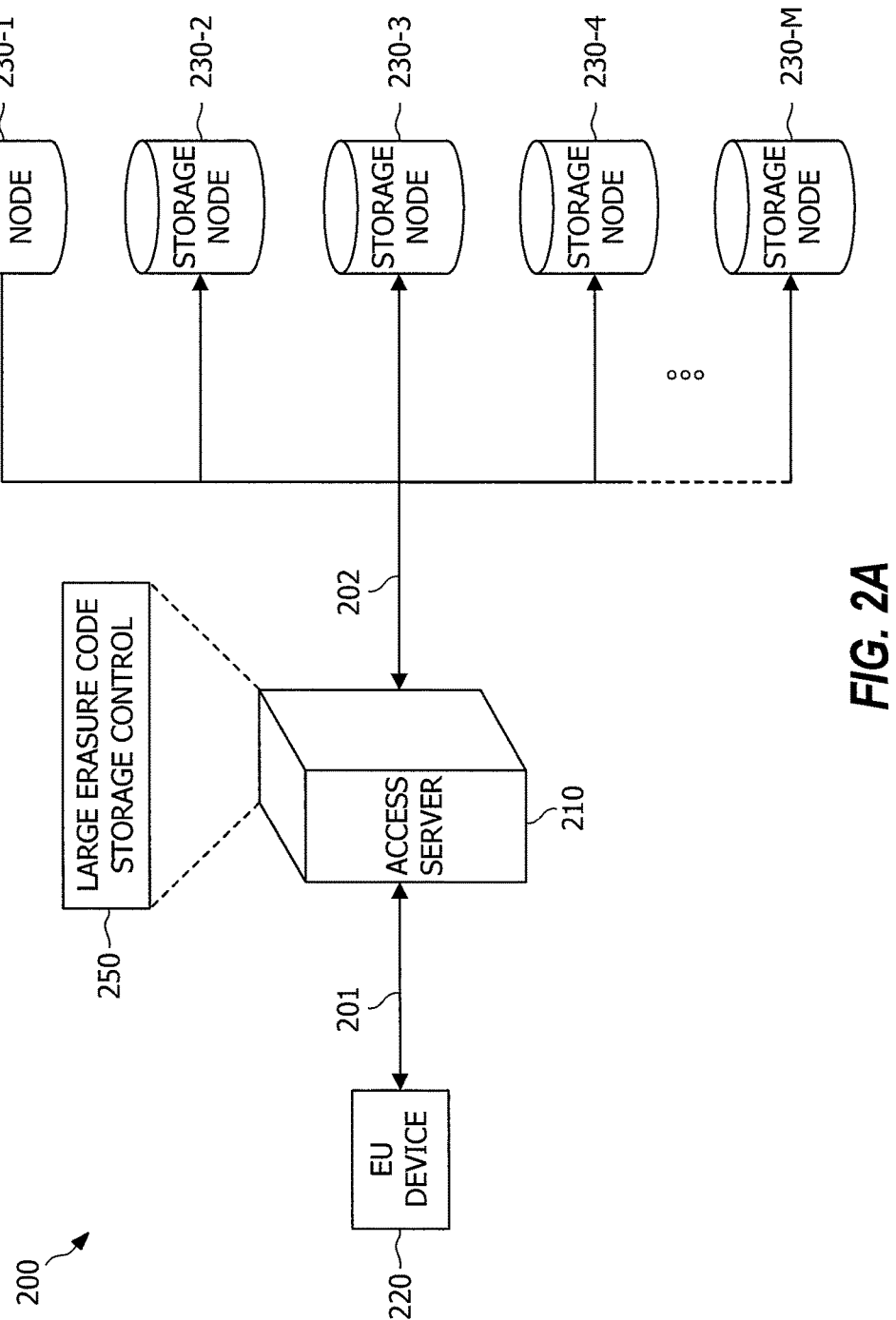
FIGS. 2A and 2B show detail with respect to exemplary implementations of storage systems adapted to provide repair bandwidth control implementing a repair regulator according to embodiments of the present disclosure.
Figure 2B:
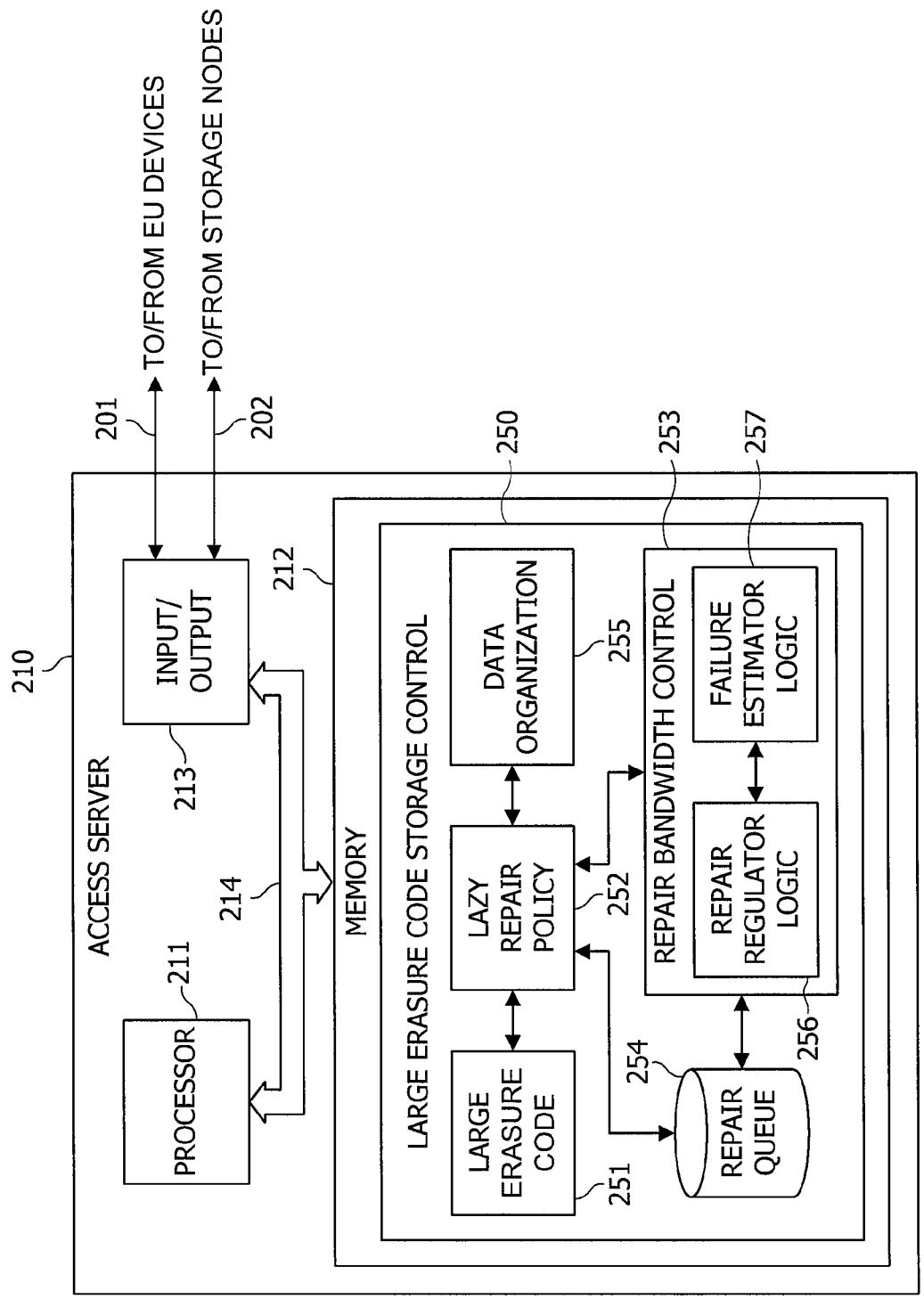

FIGS. 2A and 2B show storage system 200 adapted to provide large erasure code storage control according the concepts disclosed herein. Large erasure code storage control according to embodiments provides forward checking of data integrity, such as to assure that the objects most susceptible to failure (e.g., the objects having the fewest fragments remaining, objects having fragments stored on nodes having a higher failure rate, etc.) can still be recovered when a certain number of additional fragments are lost. For example, forward checking of data integrity may perform a real-time or near real-time check that a certain number of additional storage node failures (e.g., 5) can be tolerated without any objects becoming unrecoverable. That is, embodiments operate to prospectively analyze fragment losses with respect to one or more source objects, such as to determine the susceptibility of the storage system to source data loss.

Large erasure control according to embodiments additionally or alternatively provides operation to maintain a minimum redundancy with respect to the fragments stored by the system. For example, the repair bandwidth, R, may be provisioned or otherwise controlled to maintain a minimum redundancy, Y, in the system (e.g., maintain Y=0.1·k, Y=0.2·k, etc.). Accordingly, the repair bandwidth, R, may be shaped to maintain a minimum redundancy, Y, such as by dynamically controlling repair bandwidth (e.g., on-the-fly, in real-time, in near real-time, etc.). In operation, repair bandwidth may be increased if redundancy drops to or below the minimum redundancy metric, Y, according to embodiments. Correspondingly, the repair bandwidth may be decreased, such as when the node failure rate decreases, according to embodiments. Additionally or alternatively, large erasure control according to embodiments provides operation to provide improved access properties. For example, requests for data may be made for a number of fragments (e.g., k+Y fragments) more than that needed to decode the data, whereby the data may be decoded as soon as a sufficient number of fragments (e.g., k or k+x, where x<Y) are received, thereby avoiding node and network latency issues according to embodiments. Moreover, access speeds may be increased through a small increase in redundancy (e.g., redundancy>Y), according to embodiments. Additionally or alternatively, a data organization scheme may be employed to support efficient data accesses, such as data access to small portions of stored data, according to embodiments.

In facilitating the foregoing, the exemplary embodiment of FIG. 2A comprises access server 210, having large erasure code storage control logic 250 according to the concepts herein, in communication with EU device 220 to provide storage services with respect thereto. Source data for which storage services are provided by storage systems of embodiments herein may comprise various configurations of data including blocks of data (e.g., source blocks of any size) and/or streams of data (e.g., source streams of any size). The source objects corresponding to such source data as stored by storage systems of embodiments, may comprise individual files, collections of files, data volumes, data aggregations, etc., as well as portions thereof, as may be provided for storage processing (e.g., encoding, writing, reading, decoding, etc.) as blocks of data, streams of data, and combinations thereof. Thus, source objects herein may comprise application layer objects (e.g., with metadata), a plurality of application layer objects, some portion of an application layer object, etc. Such source objects may thus be quite small (e.g., on the order of hundreds or thousands of bytes), quite large (e.g., on the order of megabytes, gigabytes, terabytes, etc.), or any portion of data that may be separated into fragments or portions of fragments as described herein.

Access server 210 may comprise one or more servers operable under control of an instruction set to receive data from devices such as EU device 220, and to control storage of the data and to retrieve data in response to requests from devices such as EU device 220, wherein the HTTP 1.1 protocol using the GET and PUT and POST command and byte range requests is an example of how an EU device can communicate with an access server 210. Accordingly, access server 210 is further in communication with a plurality, M, of storage nodes (shown here as storage nodes 230-1 through 230-M), wherein the HTTP 1.1 protocol using the GET and PUT and POST command and byte range requests is an example of how an access server 210 can communicate with storage nodes 230-1 through 230-M. The number of storage nodes, M, is typically very large, such as on the order of hundreds, thousands, and even tens of thousands in some embodiments. Storage nodes 230-1 through 230-M may comprise a homogeneous or heterogeneous collection or array (e.g., RAID array) of storage media (e.g., hard disk drives, optical disk drives, solid state drives, RAM, flash memory, high end commercial servers, low cost commodity servers, personal computers, tablets, Internet appliances, web servers, SAN servers, NAS servers, IAN storage servers, etc.), providing persistent memory in which the electronic data is stored by and accessible through access server 210. EU device 220 may comprise any configuration of device (e.g., personal computer, tablet device, smart phone, personal digital assistant (PDA), camera, Internet appliance, etc.) that operates to generate, manage, and/or access electronic data. It should be appreciated that although only a single such device is shown, storage system 200 may operate to serve a plurality of devices, some or all of which may comprise devices in addition to or in the alternative to devices characterized as "end user" devices. Any or all of the foregoing various components of storage system 200 may comprise traditional (e.g., physical) and/or virtualized instances of such components, such as may include virtualized servers, virtualized networking, virtualized storage nodes, virtualized storage devices, virtualized devices, etc.

FIG. 2B shows additional detail with respect to access server 210 of embodiments. Access server 210 of the illustrated embodiment comprises a plurality of functional blocks, shown here as including processor 211, memory 212, and input/output (I/O) element 213. Although not shown in the representation in FIG. 2B for simplicity, access server 210 may comprise additional functional blocks, such as a user interface, a radio frequency (RF) module, a display, etc., some or all of which may be utilized by operation in accordance with the concepts herein. The foregoing functional blocks may be operatively connected over one or more buses, such as bus 214. Bus 214 may comprises the logical and physical connections to allow the connected elements, modules, and components to communicate and interoperate.

Processor 211 of embodiments can be any general purpose or special purpose processor capable of executing instructions to control the operation and functionality of access server 210 as described herein. Although shown as a single element, processor 211 may comprise multiple processors, or a distributed processing architecture.

I/O element 213 can include and/or be coupled to various input/output components. For example, I/O element 213 may include and/or be coupled to a display, a speaker, a microphone, a keypad, a pointing device, a touch-sensitive screen, user interface control elements, and any other devices or systems that allow a user to provide input commands and receive outputs from access server 210. Additionally or alternatively, I/O element 213 may include and/or be coupled to a disk controller, a network interface card (NIC), a radio frequency (RF) transceiver, and any other devices or systems that facilitate input and/or output functionality of client device 210. I/O element 213 of the illustrated embodiment provides interfaces (e.g., using one or more of the aforementioned disk controller, NIC, and/or RF transceiver) for connections 201 and 202 providing data communication with respect to EU device 220 and storage nodes 230-1 through 230-M, respectively. It should be appreciated that connections 201 and 202 may comprise various forms of connections suitable for data communication herein, such as provided by wireline links, wireless links, local area network (LAN) links, wide area network (WAN) links, SAN links, Internet links, cellular communication system links, cable transmission system links, fiber optic links, etc., including combinations thereof.

Memory 212 can be any type of volatile or non-volatile memory, and in an embodiment, can include flash memory. Memory 212 can be permanently installed in access server 210, or can be a removable memory element, such as a removable memory card. Although shown as a single element, memory 212 may comprise multiple discrete memories and/or memory types. Memory 212 of embodiments may store or otherwise include various computer readable code segments, such as may form applications, operating systems, files, electronic documents, content, etc.

Access server 210 is operable to provide reliable storage of data within storage system 200 using large erasure code storage control, such as may be configured to provide liquid distributed storage control. Accordingly, memory 212 of the illustrated embodiments comprises computer readable code segments defining large erasure code storage control logic 250, which when executed by a processor (e.g., processor 211) provide logic circuits operable as described herein. In particular, large erasure code storage control logic 250 of access server 210 is shown in FIG. 2B as including a plurality of functional blocks as may be utilized alone or in combination to provide various aspects of storage control (e.g., liquid distributed storage control operation) for reliably storing data within storage system 200. Further detail regarding the implementation and operation of liquid distributed storage control by a storage system is provided in U.S. patent application Ser. Nos. 14/567,203, 14/567,249, and 14/567,303 each entitled "SYSTEMS AND METHODS FOR RELIABLY STORING DATA USING LIQUID DISTRIBUTED STORAGE," and each filed Dec. 11, 2014, the disclosures of which are hereby incorporated herein by reference.

Large erasure code storage control logic 250 of the illustrated embodiment includes large erasure code logic 251, lazy repair policy logic 252, repair bandwidth control logic 253, and data organization logic 255. It should be appreciated that embodiments may include a subset of the functional blocks shown and/or functional blocks in addition to those shown.

The code segments stored by memory 212 may provide applications in addition to the aforementioned large erasure code storage control logic 250. For example, memory 212 may store applications such as a storage server, useful in arbitrating management, storage, and retrieval of electronic data between EU device 210 and storage nodes 230-1 through 230-M according to embodiments herein. Such a storage server can be a web server, a NAS storage server, a SAN storage server, an IAN storage server, and/or the like.

In addition to the aforementioned code segments forming applications, operating systems, files, electronic documents, content, etc., memory 212 may include or otherwise provide various registers, buffers, caches, queues, and storage cells used by functional blocks of access server 210. For example, memory 212 may comprise one or more system maps that are maintained to keep track of which fragments are stored on which nodes for each source object. Additionally or alternatively, memory 212 may comprise various registers storing operational parameters, such a erasure code parameters, utilized according to embodiments. Likewise, memory 212 may comprise one or more repair queues, such as repair queue 254, providing a hierarchy of source object instances (which represent source objects) for repair processing.

In operation according to embodiments, the source blocks of electronic data are stored in storage system 200 as objects. The source objects utilized herein may, for example, be approximately equal-sized. Source blocks, and thus the corresponding objects stored by the storage system, may comprise individual files, collections of files, data volumes, data aggregations, etc. and may be quite large (e.g., on the order of megabytes, gigabytes, terabytes, etc.). Access server 210 may operate to partition arriving source data into source objects and to maintain mapping of the source data to the source objects (e.g., Map:App-Obj comprising an application or source object map providing mapping of source data to objects). Access server 210 may further operate to erasure encode the source objects, divide the source objects into fragments, store each fragment of a source object at a different storage node, and maintain a source object to fragment map (e.g., Map:Obj-Frag comprising an object fragment map providing mapping of objects to fragments). Accordingly, the objects are partitioned by logic of access server 210 into fragments for storage in the storage system. For example, an object may be partitioned into k fragments for storage in storage system 200. Each of the k fragments may be of equal size according to embodiments. In operation according to embodiments herein the aforementioned fragments may comprise a plurality of symbols.

In implementing such partitioned storage of source data according to embodiments there can be a unique encoded symbol ID (ESI) associated with each of the M storage nodes, and all fragments stored on the storage node are generated using the ESI associated with that node. Thus a mapping may be maintained for each storage node indicating the associated ESI and a mapping may be maintained for each source object indicating which fragments are stored on which storage nodes (e.g., a Map:Obj-Frag map indicating the encoded symbol ID (ESI) and the storage node ID for each fragment of each source object). Alternatively, mapping of ESIs to storage nodes may be maintained individually for each object, or for a group of objects and thus a storage node may have a fragment associated with a first ESI for a first object and a fragment associated with a second ESI for a second object. In some embodiments, multiple ESIs may be mapped to the same storage node for an object. The foregoing mapping information may be updated for source objects indicating which fragments are available when a storage node permanently fails. Access server 210 may operate to determine which source object particular source data (e.g., source data requested by EU device 220) is contained within (e.g., using a Map:App-Obj map) and to read the data from the storage nodes storing the appropriate fragments by determining which of the fragments contain relevant source or repair data (e.g., using a Map:Obj-Frag map).

In providing resilient and reliable storage of the data, access server 210 of embodiments utilizes one or more erasure codes with respect to the source objects, wherein repair fragments are generated to provide redundant data useful in recovering data of the source object. For example, embodiments of large erasure code storage control logic implement erasure codes parameterized as (n; k; r), where k is the number of source symbols in a source block, n is the total number of encoded symbols, and r=n−k is the number of repair symbols.

An (n; k; r) erasure code solution, wherein (n; k; r) are small constants, is said to be a small erasure code solution if n<<M or if n is small independently of M (e.g. n<30, or n<20). In utilizing such a small erasure code, a source object is typically partitioned into k source fragments that are erasure encoded to generate n encoded fragments, wherein r (r=n−k) of the n fragments are repair fragments. Of the M storage nodes in the storage system, n storage nodes may then be chosen (e.g., storage nodes chosen randomly, storage nodes having independent failures chosen, etc.) and the n fragments stored to the n chosen storage nodes, one fragment per storage node. An example of such small erasure codes are Maximum Distance Separable (MDS) erasure codes. The repair strategy traditionally implemented with respect to such small erasure codes is a reactive, rapid repair policy.

An (n; k; r) erasure code solution is a large erasure code solution if n=M (i.e., for each source object there are fragments stored at all the storage nodes), if n is a significant fraction of M (e.g., n≥½·M), or if n is large although perhaps chosen independently of M (e.g., n≥50, or n≥30). An exemplary large erasure code such as may be utilized according to embodiments herein include RAPTORQ as specified in IETF RFC 6330, implementations of which are available from Qualcomm Incorporated. Further examples of large erasure codes as may be utilized herein include RAPTOR as specified in IETF RFC 5053, LDPC codes specified in IETF RFC 5170, tornado codes, and Luby transform (LT) codes.

A property of maximum distance separable (MDS) erasure codes is that all k source symbols can be recovered from any k of the n encoded symbols. Particular erasure codes that are not inherently MDS, such as the exemplary large erasure codes herein (e.g., RAPTORQ), provide a high (e.g., 99%) probability that the k source symbols can be recovered from any k of the n encoded symbols and a higher (e.g., 99.99%, 99.9999%, etc.) probability that the k source symbols can be recovered from any k+x (e.g., x=1, 2, etc.) of the n encoded symbols.

In operation, each fragment (i.e., the source fragments and repair fragments) of a source object is stored at a different storage node than the other fragments of the source object. The storage overhead is the ratio of the total target amount of repair data for all objects divided by the total target amount of source and repair data for all objects in the storage system when using a systematic erasure code for storage. Thus, the storage overhead is the target fraction of the used storage that is not for source data.

In some cases, source data is not directly stored in the storage system, only repair data. In this case, there are n repair fragments stored in the storage system for each object, where generally any k (for some erasure codes slightly more than k is sometimes utilized) of the n fragments can be used to recover the original object, and thus there is still a redundant storage of r=n−k repair fragments in the storage system beyond the k needed to recover the object. An alternative type of storage overhead is the ratio of the total amount of repair data divided by the total amount of source data, i.e., the storage overhead is r/k for this type. Generally herein r/n is used as the storage overhead, and one skilled in the art can see that there is a conversion from one type of storage overhead to the other type of storage overhead.

In operation according to a reactive, rapid repair policy, the repair of missing fragments is implemented at a high bandwidth when a storage node fails. That is, the repair policy causes repair server functionality of an access server to attempt to repair fragments lost on a storage node as soon as possible in order to repair a failed storage node before another storage node fails and in order to avoid source objects having more than one missing fragment (as is generally necessary in order to meet reliability targets in light of the small number of repair fragments, or redundant data, available using a small erasure code). Such reactive, rapid repair policies use a large amount of burst repair traffic at times that are dictated by when nodes fail and not at scheduled times. Thus, the burst repair traffic might occur at times when other processes that share the bandwidth are active, such as access processes retrieving data from the storage system or storage processes storing data to the storage system. Thus, if one of these other processes happens to be actively using bandwidth in a period of time that overlaps with the burst repair traffic triggered by a storage node failure, the performance of these other processes can be negatively impacted (e.g., degraded, by the burst repair traffic). In other deployments, when access to data is less frequent, the bandwidth for the system may be provisioned based largely on peak repair bandwidth requirements, and providing a peak bandwidth capacity that can accommodate large bursts of repair traffic may not be cost effective.

Although small erasure codes, such as those described above (e.g., n<<M), may be utilized in some embodiments, the illustrated embodiment of access server 210 implements (e.g., using large erasure code logic 251) a large erasure code (e.g., n≥½·M) solution to provide storing and accessing source data in a reliable and efficient manner within a storage system of unreliable nodes. In utilizing such a large erasure code according to embodiments, a source object may be partitioned into k source fragments that are erasure encoded to generate n encoded fragments, wherein r of the n fragments are repair fragments. The n fragments may then be stored to the M storage nodes, one fragment per storage node.

Large erasure code storage control logic 250 of embodiments implements a repair policy in order to provide recovery of lost fragments and thereby facilitate resilient and reliable storage of the source data. For example, a repair policy of large erasure code storage control logic 250 may run in the background (e.g., as a background task to a storage server application) to monitor storage nodes to determine which storage nodes have failed and provide operation to replace fragments stored on the failed storage node. In operation according to embodiments, an object to fragment mapping (e.g., the aforementioned Map:Obj-Frag map) may be utilized to keep track of where fragments are located such that when a storage node is determined to have permanently failed the loss of the fragments stored thereby are identified (e.g., the fragments which are no longer available due to failure of the storage node are determined). These fragments, or some portion thereof, may be tracked in a repair queue for repair operations in accordance with the repair policy.

Although it may be beneficial to use a reactive, rapid repair policy (i.e., when a fragment of an object is lost due to a permanent node failure, the repair policy replaces the lost fragment with another fragment as quickly as possible) for a small erasure code solution, embodiments utilize a lazy repair policy (i.e., objects are allowed to accumulate whereby they may be repaired at a steady repair rate, R), such as through operation of lazy repair policy logic 252. It should be appreciated, however, that embodiments may implement a repair policy other than a lazy repair policy, such as a reactive repair policy.

In implementing a lazy repair policy according to embodiments, the repair rate, R, is designed to ensure a large mean time to loss of any source data (MTTDL). The repair rate may be expressed as the number of bits of source objects repaired per second (i.e., the rate in bits per second that source objects are processed from a state of missing fragments to a state of having all fragments available). This form of expressing the repair rate is convenient since generally it is also corresponds to the rate at which data is read from storage nodes by the repair process. However, there are many other forms of expressing the repair rate. For example, the repair rate may be expressed as the amount of time it takes to repair each source object (e.g., in the case when all source objects are the same size), or the amount of time per byte of source object repair. As one skilled in the art will recognize, any of these forms of expressing the repair rate can be easily converted to another form. Additionally or alternatively, repair bandwidth usage may be scheduled to occur at times that are largely independent of the specific timing of node failures. For example, repair bandwidth may be scheduled to be used for a couple of hours each night when other bandwidth activity, such as access or storage of data, is quiescent. Thus, the repair process may use most or all of the available bandwidth for a short period of time on a regular basis, to avoid interrupting or disrupting other bandwidth intensive activities such as access or storage of data. As another example, the repair process may be scheduled to occur only occasionally when the storage system is powered up, and at other times the storage system is powered down to save on energy consumption and costs. The scheduling of the repair process to use repair bandwidth may also be on an irregular basis (i.e., scheduled when other processes such as reading or writing data to storage are relatively inactive). In every case, the repair bandwidth usage can be crafted to avoid interrupting other processes that send or receive data over some or parts of the same networking paths as used by the repair process, and the repair bandwidth usage can be so crafted independently of the timing of data loss events such as storage node failures. The amount of repair done during these periods may be determined by a repair policy that dictates the desired average rate of repair over longer time periods. Thus, on a longer time scale the repair process is fluid and may be modulated to respond to changing conditions such as node failure rates while on a short time scale the repair may be scheduled for system convenience such as described in the preceding examples.

In operation, logic of the repair policy may, based on the aforementioned system maps, determine which fragments are available and which are missing for each source object. Repair processing is performed according to embodiments with respect to those fragments that are determined to be permanently lost, such as due to permanent failure of the storage node upon which the fragment is stored. Permanent failure of the storage nodes is often modeled by a Poisson process parameterized by $\lambda$, which denotes the failure rate of each node according to an exponential distribution. In a lazy repair setting a time varying rate parameter $\lambda$ may be a more suitable model to capture changes in conditions, quality of components, etc.

The repair policy of embodiments maintains a repair queue of object instances (e.g., repair queue 254), which represent source objects, wherein a source object instance is added to the repair queue for a source object when it is possible to generate and store additional fragments for that source object (e.g., when storage nodes that store fragments for that source object have failed, when new or replacement storage nodes have been added to the storage system, etc.). Embodiments implementing a large erasure code solution using a lazy repair policy may operate to add a source object instance to the repair queue when a pre-specified minimum number (e.g., minQ>1, minQ=1, etc.) of fragments for that source object are lost due to node storage failures, such as to limit the overall amount of repair traffic. Equivalently, all objects may be in the queue but repair is suspended when no object has more than minQ erased fragments.

Whenever there is at least one source object instance in the repair queue that has a sufficient number of missing fragments the repair policy of embodiments works to repair the source objects corresponding to source object instances in the repair queue. For example, logic implementing the repair policy may linearly cycle through the object instances in the repair queue, read in at least k fragments to recover a source object in need of repair, and generate and store additional fragments for the source object on one or more replacement storage nodes.

As can be appreciated from the foregoing, storage systems implementing a lazy repair policy allow for repair bandwidth efficiency whereby the repair of failed storage nodes can be deferred. However, such deferral of the repair of the storage nodes benefits from some mechanism (e.g., repair bandwidth control logic 253) operable to determine the appropriate repair bandwidth because the repairs may not be initiated upon storage node failure. Although a constant repair bandwidth targeted to achieve a performance metric (e.g., MTTDL) may be used, establishing such a constant repair bandwidth may depend upon assumptions regarding storage node failure rates that may or may not prove accurate. Moreover, utilization of a constant repair bandwidth, providing a constant repair rate, does not respond to fluctuations in storage node failure rates or other operational variations experienced in the dynamic environment of a storage system. Accordingly, embodiments herein implement repair bandwidth control techniques, such as may provide a feedback control structure for regulating repair bandwidth in the storage system. The time scale over which the feedback is applied according to embodiments is often on a larger time scale, for example large enough that daily scheduling of repair can be done for system convenience, as described above. However, there are circumstances when faster regulation of the repair rate can be beneficial, for example if an unusual set of events occur, such as the failure of a large number of the storage nodes over a short period of time.

Repair bandwidth control logic 253 implemented according to embodiments may, for example, comprise a feedback controller that dynamically determines repair rates (e.g., repair bandwidth to be utilized in repairing missing fragments) based on a source object repair queue and storage node failure rate estimates. The aforementioned repair queue (e.g., repair queue 254) may include information regarding the repair state of source objects stored in the storage system. These source objects may be erasure coded and partitioned into fragments which are stored on the storage nodes of the storage system, whereby a failed storage node results in erasure (unavailability) of the fragments stored thereon and the redundancy of the erasure code may be relied upon to ensure availability of the original source data. In deferring repair of missing fragments, a repair bandwidth control technique may thus rely upon long term statistics of the storage node failure process to determine a rate at which the repairs are to be implemented without loss of data. It is desirable to operate the repairs at high efficiency (e.g., implementing repair of a large number of failed fragments for a source object during one repair operation to provide fragment read efficiency). A conflicting goal, however, is to ensure that the number of missing fragments for a source object does not exceed certain thresholds. One such threshold is the redundancy of the erasure code (e.g., the number of fragments that can be lost such that the source data is still recoverable from the remaining, available fragments). If the erasure code is not inherently MDS (Maximum Distance Separable), which is often the case for a large erasure code, then this threshold may be set to a smaller number of fragments than would be allowed by the parameters of the code assuming MDS performance. There may be other reasons for preferring a threshold of a smaller number of lost fragments, such as to facilitate online code verification of code resiliency, to have low probability of data loss, to have excess fragments available for access diversity thereby reducing access latencies, etc. Embodiments of feedback control implemented by repair bandwidth control logic herein are adapted to achieve the foregoing objectives, such as by adjusting the repair rate depending on the state of the repair queue and estimates of the storage node failure arrival process. Operation according to embodiments achieves greater repair efficiency while improving other storage system metrics, such as MTTDL.

Although embodiments operable to adjust the repair rate based on the state of the repair queue and estimates of the storage node failure arrival process are described herein, it should be appreciated that repair bandwidth adjustments made in accordance with the concepts herein may additionally or alternatively be based on other metrics, attributes, and/or considerations. For example, repair bandwidth may be adjusted according to embodiments in reaction to how much source data is stored in the storage system. In operation of one such embodiment, if initially there is relatively little source data stored by the storage system, the repair rate may be relatively low, whereby as more source data is added to the storage system then the repair rate may be increased. Correspondingly, if source data is deleted from the storage system, then the repair rate may be decreased (e.g., where all other storage system parameters remain unchanged). It should be appreciated that the foregoing repair rate adjustments based on the amount of source data in the storage system may be combined with other criteria for repair rate adjustment in determining the repair rate implemented. For example, analysis of the amount of source data within the storage system may be utilized in incrementally adjusting a repair rate determined based on the state of the repair queue and estimates of the storage node failure arrival process.

Figure 3:
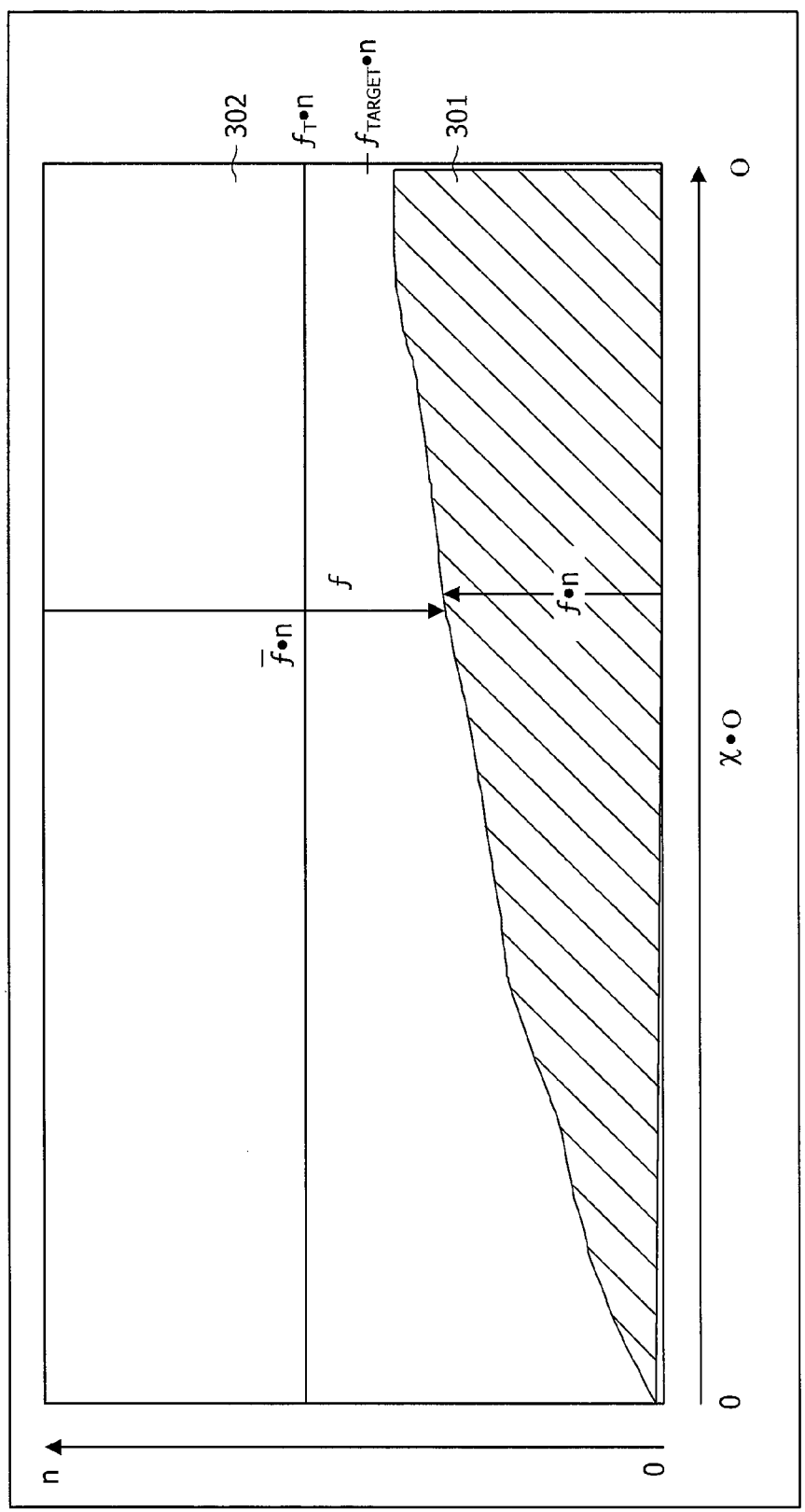
FIG. 3 shows a repair queue for repair bandwidth control operating to provide deferred source object repair according to embodiments of the present disclosure.

In explaining concepts of repair bandwidth control according to embodiments, it is helpful to understand the operation of a repair queue implemented with respect to a lazy repair policy or other repair policy in which repairs are deferred. Directing attention to FIG. 3, a repair queue (e.g., repair queue 254 of FIG. 2B) for a storage system having been in operation over some period of time is illustrated. In the illustration of FIG. 3, the horizontal axis represents the source objects (e.g., $\circlearrowleft$ is the total number of source objects in the storage system), wherein x represents the relative position of a source object in the queue, and the vertical axis represents the source object fragments (e.g., n is the total number of fragments per source object). The shaded section below the curve (section 301) represents the lost (e.g., erased or otherwise missing) fragments, whereas the unshaded section above the curve (section 302) represents the remaining (e.g., available) fragments. Accordingly, the graph of FIG. 3 can be thought of as the entire set of source objects in the storage system ordered by their set of available fragments (or inversely by their set of missing fragments). It can be appreciated from the graph of FIG. 3 that as the relative position of a source object in the repair queue is more toward the right (i.e., towards the head of the repair queue), the number of missing fragments is larger. Accordingly, the source object having the least number of available fragments (or most missing fragments) will be at the head of this repair queue (e.g., the source object in most need of repair). Conversely, the source object having the most available fragments (or fewest, possibly no, missing fragments) will be at the tail of this repair queue (e.g., the source object for which repairs have just completed such that it is cycled back to the tail of the repair queue after having been repaired).

For simplicity, it is assumed in FIG. 3 (and much of the remainder of this disclosure) that all source objects are the same size. In general, different source objects may differ in size. As one skilled in the art will recognize, the portions of this disclosure that assume equal-sized source objects can be easily extended to apply to differing size source objects. For example, when not all source objects are the same size, the horizontal axis in FIG. 3 can represent the total size of all source objects preceding the source object, and thus the maximum value along the horizontal axis (corresponding to the source object at the head of the repair queue) is the total size of all source objects.

In operation according to some embodiments of a large erasure code, fragments for each source object are stored on each storage node of the storage system (i.e., the number of fragments per source object is equal to the number of storage nodes, or n=M). In such a configuration, a storage node may be said to be complete if it has a fragment from every source object. Accordingly, if such a complete storage node fails, every source object loses one fragment (e.g., the graph shown in FIG. 3 shifts up by one fragment). However, it is possible that some storage nodes are not complete (e.g., a storage node recently added to the storage system may fail prior to the completion of the repair process repairing all source objects, and thus prior to fragments for each source object having been stored to the storage node). Such storage nodes may be referred to as partial storage nodes. The failure of a partial storage node results in one or more source objects losing a fragment and/or one or more source objects not losing a fragment. Source objects losing a fragment may change positions in the repair queue with respect to source objects not losing a fragment. If, however, the repair process ensures that the set of missing fragments is increasing along the queue, then objects will not change position in the queue but only those objects more toward the tail of the queue will lose additional fragments. A horizontal line in FIG. 3 that intersects the queue can be understood as representing a partial storage node where the shaded portion below the curve represents missing fragments.

As can be appreciated from the foregoing, the failures of storage nodes and the repair of the source objects present competing processes within the operation of a storage system, whereby the repair process is attempting to rebuild the system by generating and storing fragments for source objects with erased fragments as the failure process is operating to tear the system down by erasing fragments for source objects as storage nodes fail. A challenge is presented in controlling the repair process so as to repair the fragment losses at a rapid enough pace so as to prevent permanent loss of source data, while maintaining efficiencies within the storage system (e.g., repair bandwidth efficiency, repair efficiency, etc.). The challenge is further complicated by such operational aspects as the failure rate of the storage nodes not being known, the failure of storage nodes affecting particular source objects differently, etc.

Repair bandwidth control provided according to embodiments implements repair regulator logic (e.g., repair regulator logic 256 of FIG. 2B) operable to ensure that objects in the aforementioned repair queue are repaired at a time that the number of missing fragments therefor do not exceed a predetermined threshold value (e.g., $f_T \cdot n$ shown in FIG. 3). That is, in operation according to embodiments when a source object reaches the head of the repair queue, and thus is taken up for repair by the repair policy, that source object has no more than $f_T \cdot n$ erased fragments, where $f_T$ is a value between 0 and 1. The fragment loss threshold value, $f_T$, may be selected for provisioning repair regulator logic, for example, so as to provide high reliability with respect to recovery of the source data (e.g., establishing a minimum redundancy, Y, with respect to the fragments stored in the system). In the case of an MDS code $f_T \cdot n$ may be equal to n-k and represent the threshold of data loss. In the case that erasure code is not inherently MDS $f_T \cdot n$ will typically be smaller than n-k to maintain minimum redundancy for improved access and reliability guarantees. Accordingly, embodiments provide for implementing fragment repair using a repair bandwidth, R, that is controlled to avoid disruptive increases and/or which is maintained at an essentially steady pace (dynamic adjustment nevertheless being provided), while providing a very large MTTDL and very low probability of any object exceeding $f_T \cdot n$ erased fragments.

Embodiments further provide for implementing the fragment repair efficiently (e.g., allowing for a suitably large number of missing fragments that are generated for the repair). Thus, embodiments of the repair regulator logic provide fragment repairs at a rate that strikes a balance between fragment losses being low enough for a high probability of data recovery and the number of fragments generated by the repair (e.g., to replace the fragment losses) being large enough to result in suitable repair efficiency.

Figure 4:
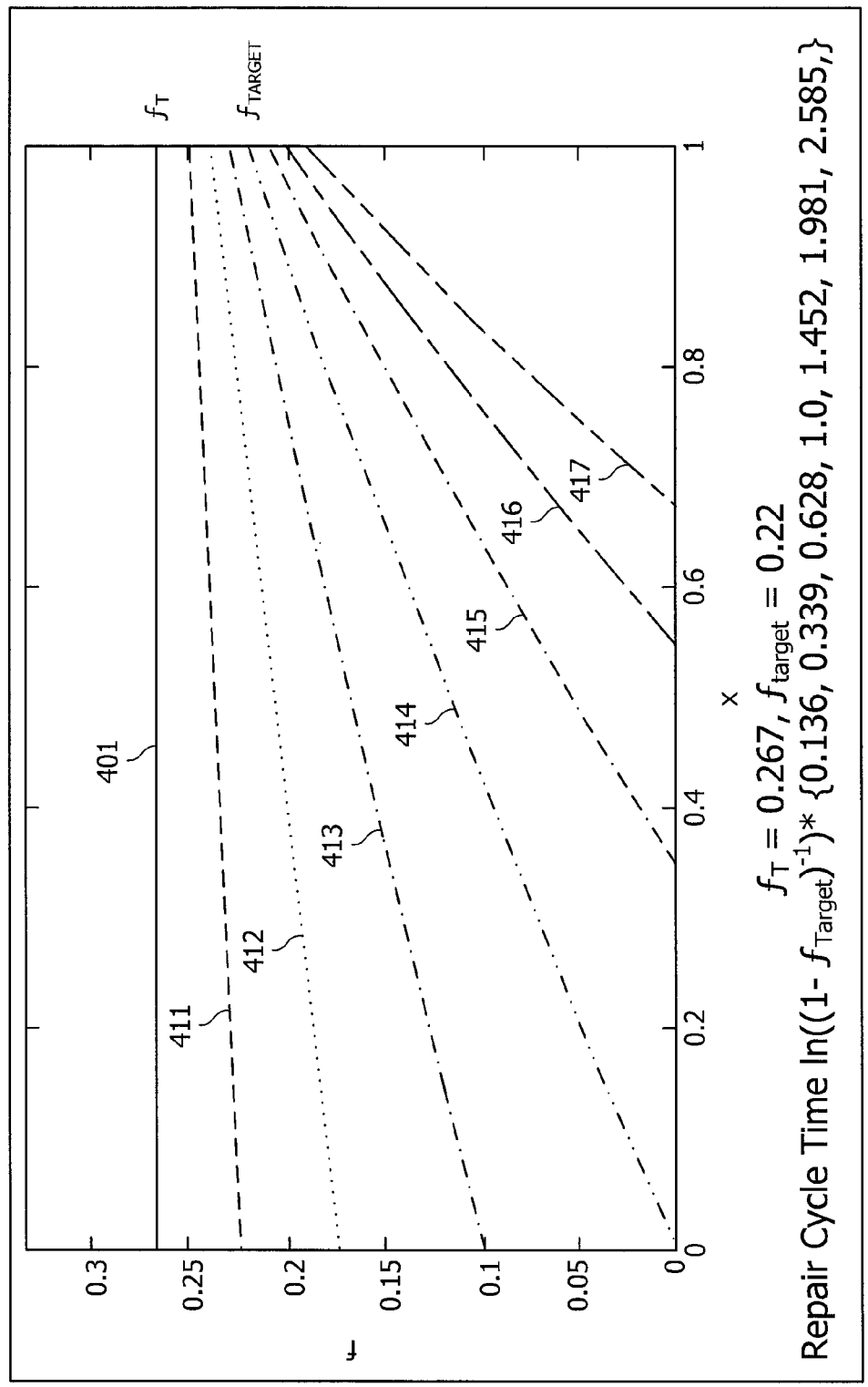
FIG. 4 shows graphs of various constant repair rate trajectories relative to a fragment loss threshold value according to embodiments of the present disclosure.

FIG. 4 shows graphs of various constant repair rate curves (shown as repair rate curves 411-417) for a repair policy based aforementioned fragment loss threshold value $f_T$ (shown as threshold 401) and an efficiency target $f_{Target}$ described below. The vertical axis represents the relative number of fragments lost for each source object, (i.e., the vertical axis value f of FIG. 4 for a source object with F erased fragments is f=F/n). The horizontal axis represents relative position in the repair queue where 1 is the head of the queue and 0 is the tail of the queue (i.e. the horizontal axis value x of FIG. 4 for a source object at position L in the repair queue is x=L/☉ ). More generally, when source object sizes differ, the horizontal axis value for a source object at position L is the sum of the sizes of all objects preceding the source object at position L divided by the sum of the sizes of all ☉ objects. Under the repair policy an object in relative position x with a fraction of erased fragments f estimates a repair rate (e.g., expressed in the form of the amount of time for repair of each source object) for the current repair that is given by $\lambda^{-1} \cdot \Phi(f,x)$ where $\Phi(f,x)$ is a function of f and x and $\lambda$ is the node failure arrival rate, which in FIG. 4. has been taken to be 1. Curves 411-417 are level curves of this function. As detailed below, each of the constant repair rate curves 411-417 is also the expected trajectory of an object's fraction of erased fragment as it advances through the repair queue assuming the estimated repair rate is used to repair each source object ahead of it in the repair queue. Thus in FIG. 4 the curves also represent possible trajectories of source objects as they advance through the repair queue assuming storage node failures occur at a predictable, constant rate (e.g., in accordance with a known Poisson process) and that the repair rate is as estimated. Curve 414 represents the nominal repair rate trajectory which is the expected trajectory for a source object entering the repair queue with zero erased fragments when the repair rate is held constant so that when the source object is repaired its number of erased fragments that is recovered is given by ($f_{Target} \cdot n$), where $f_{Target}$ may represent a target fraction of the total number of fragments which is selected so as to ensure recovery of source data and to provide a desired level of repair efficiency. With λ=1 it can be determined that the time to repair all objects in the queue once on the nominal trajectory is given by $-\ln(1-f_{Target})$. The various curves represent repair rates, expressed using the implied effective time to repair all objects as a factor of the repair time associated to the nominal curve (e.g., 0.136 times the nominal repair time for the repair rate trajectory 411, 0.339 times the nominal repair time for the repair rate trajectory 412, 0.628 times the nominal repair time for the repair rate trajectory 413, 1.0 times the nominal repair time for the repair rate trajectory 414, 1.452 times the nominal repair time for the repair rate trajectory 415, 1.981 times the nominal repair time for the repair rate trajectory 416, and 2.585 times the nominal repair time for the repair rate trajectory 417).

In accordance with the repair rate trajectories of FIG. 4, a source object in the repair queue is repaired at the point that the repair trajectory reaches the right side of the graph (i.e., 1 on the horizontal axis). Repair rate curve 414 represents the nominal repair rate trajectory which provides a data recovery rate equal to that of the predicted data loss rate, so that upon repair of a source object the number of erased fragments reaches a target number of fragments ($f_{Target}\cdot n$). This target number of fragments, $f_{Target}\cdot n$, may represent a target number of fragments that is selected so as to ensure recovery of source data and to provide a desired level of repair efficiency. As can be seen in the illustration of FIG. 4, each of the other repair rate trajectories (i.e., repair rate trajectories 411-413 and 415-417) converge around the nominal repair rate trajectory (i.e., repair rate trajectory 414). Thus, the repair policy has the property that the number of repaired fragments is typically close to the target fraction of fragments, $f_{Target}$, (and the end point in each trajectory is below the fragment loss threshold value). In operation of repair regulator logic of embodiments, fragment repair is controlled such that the state of the repair queue tracks the nominal repair rate trajectory reasonably closely, realizing that variations in repair processing from this nominal repair rate trajectory may nevertheless be tolerated and a target number of fragments ($f_{Target}\cdot n$) per source object repaired may be approximated, without exceeding a fragment loss threshold ($f_T$).

Repair regulator logic 256 of embodiments operates to ensure with high probability that each source object is repaired prior to the number of missing fragments for a source object reaching the fragment loss threshold value ($f_T$). Additionally, in order to realize repair efficiencies, repair regulator logic of embodiments operates to control the repair rate to cause repair of a source object to be initiated when that source object has a target number of erased fragments ($f_{Target}\cdot n$). It should be appreciated that various fluctuations in the operation of the storage system, its components, its usage, etc. (e.g., the storage nodes may not actually fail at a modeled or predicted rate) may prevent operation of the repair bandwidth control from exact tracking of the nominal repair rate trajectory (or any constant repair rate trajectory). Accordingly, repair regulator logic of embodiments operates dynamically to control the probability that the repair policy will operate to repair the source objects as the source objects reach the target threshold number of erased fragments ($f_{Target}\cdot n$), and thus provides repair rate control approximating repair along a nominal or otherwise desired repair rate trajectory (e.g., repair rate trajectory 414).

Although an exemplary embodiment is described above with reference to the use of a fragment loss threshold value ($f_T$) and a target number of erased fragments ($f_{Target}\cdot n$), it should be appreciate that repair regulator logic of embodiments may operate to provide desired repair efficiency and data reliability using additional or alternative parameters. For example, upper ($a_U$) and lower ($a_L$) threshold values may be utilized according to embodiments, wherein the goal is to repair source objects when the number of missing fragments is in the range $a_L \ldots a_U$ (e.g., repairs are not initiated until the source object has at least $a_L$ erased fragments and is repaired prior to having more than $a_U$ erased fragments), wherein $a_U$ and $a_L$ are integer valued. In operation according to an embodiment implementing such upper and lower threshold values, the repair of a source object occurs when at most $a_U$ fragments are missing (e.g., to ensure reliability) and when at least $a_L$ fragments are missing (e.g., to ensure efficient repair). It should be appreciated that such embodiments operate to provide repair of source objects without using too much bandwidth to repair because at least $a_L$ fragments are generated and restored during repair when reading k fragments of a source object, and thus the efficiency is at least $(a_L)/k$.

It should be appreciated that various metrics (e.g., the fragment loss threshold value ($f_T\cdot n$), the target number of erased fragments ($f_{Target}\cdot n$), upper threshold value ($a_U$), lower threshold value ($a_L$), etc.) for provisioning, configuring, or reconfiguring the operation of repair bandwidth control in accordance with embodiments herein may be selected at various appropriate times. For example, such metrics may be preselected for initial deployment and provisioning of a storage system. Additionally or alternatively, such metrics may be selected at one or more points in the operation of the storage system, such as periodically, upon the occurrence of an event, etc. For example, the fragment loss threshold value ($f_T$) may be selected or adjusted in response to a change in the storage system configuration (e.g., permanent addition of storage nodes or a change in code rate). Likewise, the target number of erased fragments ($f_{Target}\cdot n$) may be selected or adjusted in response to a determination that the probability of a desired MTTDL is being achieved is insufficient (e.g., forward looking decoding analysis with respect to the source objects may show an unacceptable probability of data loss within a MTTDL period). Additionally or alternatively, the metrics utilized according to embodiments may depend on peak bandwidth available for repair, desired volatility in repair bandwidth (as $f_T - f_{Target}$ is made smaller the system becomes more reactive), change of code rate or block size, efficiency of the 'look-ahead' resiliency calculation, desired additional redundancy for access, and/or the like.

Figure 5:
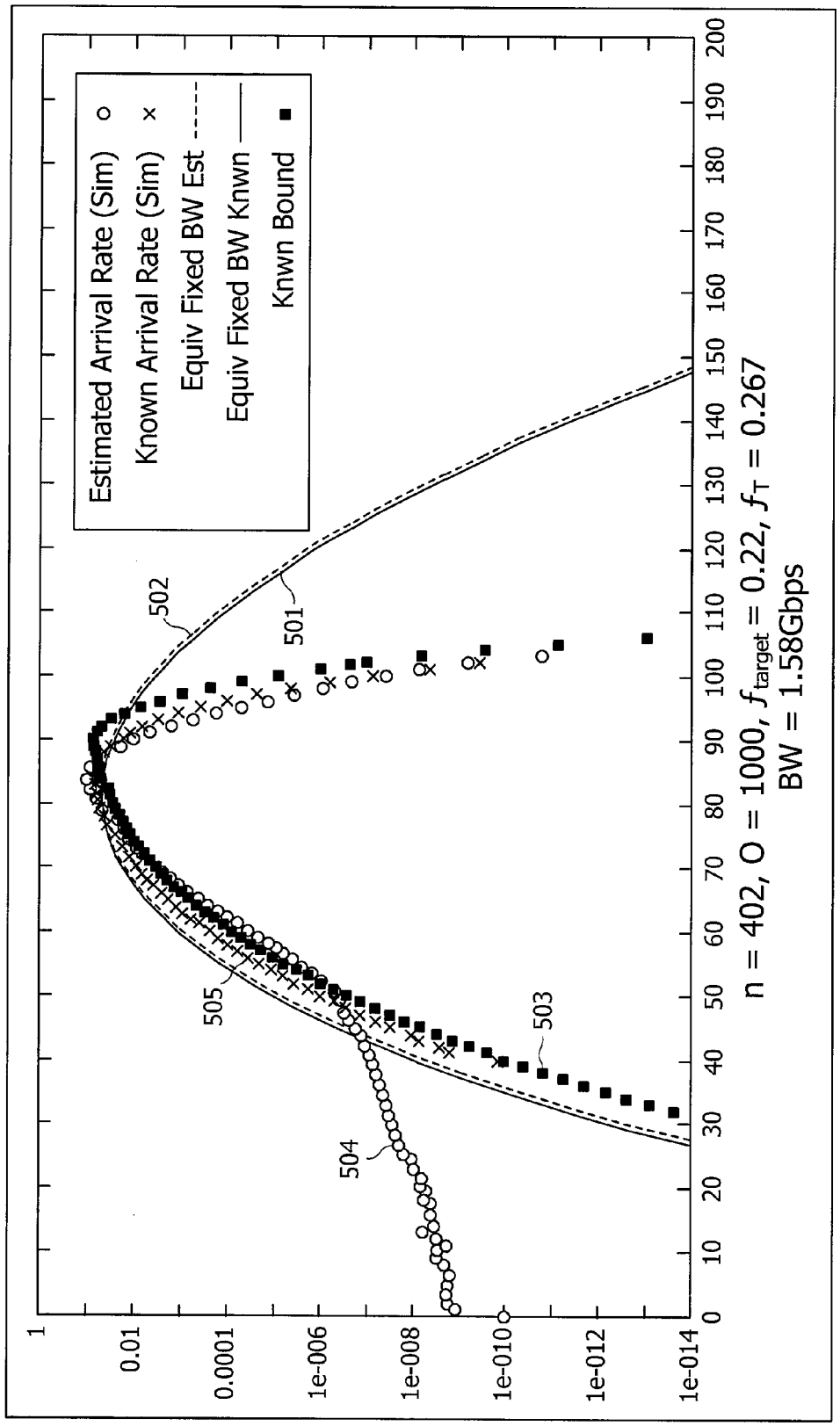
FIG. 5 shows distributions of failed fragments at the head of a repair queue for various repair rate cases according to embodiments of the present disclosure.

FIG. 5 illustrates the distributions of failed fragments at the head of the repair queue (i.e., the number of missing fragments when a source object reaches the head of the repair queue) for various repair rate cases, wherein the horizontal axis is the number of fragments missing/repaired and the vertical axis is the probability (log scale). Some of the curves are simulation results, some are analytically determined, and some are computed bounds on the distribution. All of the graphs of FIG. 5 are based on Poisson node failure arrivals, in some cases where the rate is known and in others where it is estimated. In the graphs of FIG. 5, a fixed, constant storage node failure arrival rate is assumed, wherein each graph represents a different repair rate case. Distributions 501 and 502 represent constant repair bandwidth with known storage node failure rate where the average repair rates have been chosen to be the same as those for curves 505 and 504 respectively. Distribution 503 represents a mathematical bound on the distribution that can be used to obtain a lower bound on MTTDL. Distribution 504 represents simulation of a repair regulator controlled repair bandwidth with estimated storage node failure rate case, and distribution 505 represents simulation of a repair regulator controlled repair bandwidth for the known storage node failure rate case. Both distributions use the function Φ, described below, for determining the rate according to embodiments herein, but for distribution 505 the failure arrival rate was assumed known whereas for distribution 504 an estimation process was used according to embodiments herein.

It can be seen from distribution 501 that, in the constant repair bandwidth with known storage node failure rate case, the repair policy will operate to repair approximately 80 fragments for a source object when the source object reaches the head of the repair queue. Similarly, it can be seen from distributions 504 and 505 that, in the repair regulator controlled repair bandwidth simulation cases, the repair policy may likewise operate to repair approximately 80 fragments for a source object when the source object reaches the head of the repair queue. It can also be seen from distribution 501 that, in the constant repair bandwidth with known storage node failure rate case, the probability of reaching 130 missing fragments (e.g., a threshold number of fragments at which data loss results) before the repair is initiated (i.e., the source object reaches the head of the repair queue) is approximately 10e-10. However, as can be seen from distributions 504 and 505, in the repair regulator controlled repair bandwidth simulation cases, the probability of reaching 110 missing fragments (fewer than 130 by 20) before the repair is initiated may be negligible (e.g., below 10e-14). Accordingly, repair regulator logic according to embodiments herein may operate to provide repair efficiency similar to that of a nominal repair trajectory ideal case, while providing higher data reliability, e.g., a larger MTTDL. Alternatively, repair regulator logic according to embodiments may be operated to provide higher repair efficiency than that of a nominal repair trajectory ideal case, while providing similar data reliability.

In operation according to embodiments a repair queue is maintained, whereby source objects are ordered according to their respective missing fragments, and a repair regulator process analyzes source objects in the queue to determine a repair rate for maintaining a probability that the repair policy will implement repair of source objects when the number of missing fragments reaches or approximates a predetermined target missing fragment threshold value ($f_{Target}$). For example, a first source object may be analyzed individually to determine a corresponding repair rate so that if source objects are repaired at this repair rate until the first source object reaches the head of the repair queue then the number of fragments the first source object is missing when the first source object reaches the head of the repair queue reaches or approximates the predetermined target missing fragment threshold value. More precisely, the repair rate is chosen to approximate the probability of exceeded $f_T \cdot n$ missing fragments upon repair as would be experienced by an object on the nominal trajectory under a constant repair rate policy targeting $f_{Target}$ in accordance with embodiments described herein. Similar analysis may be performed with respect to some (e.g., the source objects most at risk, having some threshold level of erased fragments, most near the head of the repair queue, etc.) or all of the source objects represented in the repair queue. The repair rates for the source objects analyzed are utilized according to embodiments to select a repair rate (e.g., as may be implemented as a repair bandwidth, R) for use with respect to the repair of source objects currently at the head of the repair queue. For example, a highest repair rate determined with respect to a plurality of source objects analyzed may be utilized according to embodiments.

The analysis of the repair queue and associated implementation of a selected repair rate may be implemented continuously, periodically, upon the occurrence of an event (e.g., storage node failures and/or source object repair completion), etc. For example, the analysis of the repair queue and associated implementation of a selected repair rate may be performed once per day, such as during an off-peak time for the storage system. As other examples, the analysis of the repair queue and associated implementation of a selected repair rate may be triggered by a pre-determined number of storage node failures, by a pre-determined number of additions of storage nodes, by the repair of a pre-determined number of bytes of source objects, by the passage of a pre-determined amount of time, and by combinations of the foregoing.

As previously mentioned, the storage node failure rate experienced with respect to a storage system may not be accurately reflected by an estimate or predictive model (e.g., a Poisson process model). For example, storage systems are not infinitely large, and thus modeling of the storage node failure rate may diverge from the storage failure rate experienced. Additionally, storage nodes may fail in groups or clusters, such as may be associated with a batch of defective devices from a particular manufacturer/shipment, a common point of failure such as a rack housing a number of storage nodes, etc. Accordingly, repair bandwidth control implemented according to embodiments utilize failure estimator logic (e.g., failure estimator logic 257 of FIG. 2B) operable to derive estimates of the storage node failure rate(s) experienced in the storage system. For example, failure estimator logic of embodiments may analyze the storage node failures as they occur in order to derive an estimate of the storage node failure rate. Storage node failure rate estimates of embodiments are determined on a source object by source object basis (e.g., to accommodate the varied impact of failure of partial storage nodes on the source objects and to vary the scale of past history of failures incorporated into the estimate according to the distance of the object from repair and from hitting the threshold target of missing fragments $f_T \cdot n$).

Failure estimates provided according to embodiments are dependent on the number of missing fragments. For example, a time scaler may be utilized in which the amount of time in the past that storage node failures are analyzed for deriving a storage node failure rate is related to the number of missing fragments (e.g., the less the number of missing fragments, the longer in the past the actual storage node failures experienced are used in the storage node failure estimate). That is, in operation according to embodiments, the further a source object is towards the head of the repair queue, the smaller the time constant for deriving an associated storage node failure estimate. Such embodiments facilitate storage node failure estimates that are reactive to recent history (e.g., sudden increased storage node failure rate) with respect to source objects nearing the predetermined target missing fragment threshold value ($f_{Target}$) to thereby decrease the probability that the fragment losses reach the fragment loss threshold value ($f_T$).

Repair regulator logic of embodiments utilizes the foregoing storage node failure estimates in the aforementioned analysis of the source objects in the queue. For example, an individual source object repair rate preference may be based on a storage node failure rate that is over a window of approximately the number of additional storage node failures (δ) before the source object reaches the target missing fragment threshold value ($f_{Target}$). In operation according to embodiments, repair regulator logic may calculate a probability distribution on the time till an additional storage node failures ($P_\delta$) occur, wherein the probability distribution may be based on historical storage node failure rates from the past, perhaps with more weight on the recent past and/or weights on storage node failures based on the type of hardware or software used in the storage nodes, etc. Accordingly, corresponding repair rates for maintaining a probability that the repair policy will implement repair of the source objects so that the fraction of missing fragments remains below the predetermined threshold value $f_T$·n may be adaptive to the storage node failure rate experienced in the storage system (e.g., as experienced with respect to the individual source objects).

It should be appreciated that various techniques for estimating or otherwise determining the storage node failure rates may be combined with various techniques for determining the repair rates to be implemented according to embodiments herein. For example, the aforementioned upper and lower threshold value ($a_U$, $a_L$) repair operation may be combined with the foregoing probability distribution function technique for determining additional storage node failures, such as to give the condition: let $t_U$ be the amount of time that with respect to $P_\delta$ that a source object is missing at most $a_U$ fragments with high probability, and let $t_L$ be the amount of time that with respect to $P_\delta$ that the source object is missing at least $a_L$ fragments with reasonably high probability (e.g., the probability that the source object is missing at least $a_L$ fragments may be relaxed and/or $a_L$ may be made relatively small to ensure that $t_L < t_U$), then the target is (e.g., individual source object repair rate preferences may be determined) to repair the source object between times $t_L$ and $t_U$. A global repair rate metric may thus be dynamically derived from the individual source object repair rate preferences for one or more of the plurality of source objects.

Having generally described concepts of repair bandwidth control implementing repair regulator logic above, further details with respect to exemplary embodiments are provided below to aid in understanding the foregoing concepts. It should be appreciated that the particulars of such exemplary embodiments are not limitations with respect to the application of the concepts being explained.

The following exemplary embodiments consider a data storage system in which erasure coded source objects are partitioned into n fragments and each fragment is stored on one of the n storage nodes of the storage system. The erasure code used to protect the data may generate n encoded symbols for a source block of information or source symbols. For the purposes of the examples, the fragments may be viewed as the encoded symbols of the erasure code, although in practice each source object may comprise many source blocks and each fragment of a source object may comprise an encoded symbol from each source block of the source object.

In operation according to exemplary embodiments, a "weaver" data organization technique, in which the symbols are spread across the storage nodes with one codeword symbol per node, is utilized with respect to the data stored in the storage system. Further detail regarding the implementation and operation of such weaver data organization techniques by a storage system is provided in U.S. patent application Ser. No. 14/567,303 entitled "SYSTEMS AND METHODS FOR RELIABLY STORING DATA USING LIQUID DISTRIBUTED STORAGE," filed Dec. 11, 2014, the disclosure of which is hereby incorporated herein by reference.

A dynamic process in which storage nodes fail (are lost) is assumed in the following exemplary embodiments, whereby the failed storage nodes are subsequently repaired (replaced with storage nodes that are initially empty and that have fragments for source objects written to them over time). When a storage node is lost the fragments it is storing are erased or otherwise are no longer available.

The repair process implemented according to the exemplary embodiments below operates to regenerate and write to storage nodes previously erased fragments of source objects, using the erasure correcting capability of the erasure code to regenerate the missing fragments. The regenerated fragments for the previously erased fragments may thus be written to the replacement storage nodes. For the purposes of the exemplary embodiments, the replacement of a lost storage node with a new storage node will be considered instantaneous, although in practice it may be some period of time (e.g., a week) before a lost storage node is replaced.

In operation according to embodiments, after a source object is repaired all of its fragments are intact, meaning it has zero erased or otherwise missing fragments. This condition may persist until the next storage node failure. It should be appreciated, however, that at any point in time different source objects can have different numbers of missing fragments, such as due to previous storage node failures and source object repairs. The source objects of embodiments are logically ordered by the number of their missing fragments, wherein this ordered sequence may be referred to as a repair queue. In this perspective the repair process is a service provided to source objects that wait in the repair queue to access the service. At the head of the repair queue is a source object with the maximal number of missing fragments and it is this object that undergoes repair according to embodiments. At each point in time a source object has a position in the repair queue of embodiments. If $\mathcal{O}$ is the total number of source objects, then the position is an element of [0: $\mathcal{O}$ −1]. This notion can be generalized to fractional positions to capture the notion of partial source object repair. This notion can also be generalized to take into account source objects of differing sizes. These generalizations become significant when the repair process is considered in continuous time. The head of the repair queue is position $\mathcal{O}$ −1 and the tail is position 0, so the number of missing fragments is increasing with position. For simplifying the analysis, it may be assumed that the source object at the head of the repair queue is fully repaired instantaneously at the end of its repair period. Accordingly, a source object may be referred to as moving from its current position $\mathcal{O}$ −1 to position zero, meaning that its repair completes. At that point, when the repair is complete, the source object is released from the head of the repair queue and enters the tail with zero missing fragments according to embodiments. Under this interpretation of the repair process, all source objects are in the repair queue at all times and under this model the cyclic order of the source objects is invariant. According to embodiments, the set of erased fragments is monotonic in the repair queue. The set of erased or missing fragments of a source object in position L contains the set of erased fragments of any source object in position L'<L. Thus, all of the fragments that are available for the source object at the head of the repair queue (just before the source object is repaired) are also commonly available for all other source objects in the repair queue.

In considering a fractional position, a source object will have a continuous position L(t). The discrete position discussed above will thus be L=⌊L(t)⌋, according to embodiments.

A repair regulator implemented according to embodiments operates to determine the rate at which source objects are repaired. This may be represented as the repair regulator determining the amount of time allocated for the current source object repair. This time allocation (e.g., the repair rate) may be updated at certain times, such as storage node failures, source object repair completion, etc., according to embodiments herein. The time allocation can also be updated continuously according to embodiments. Continuous updating is also a convenient abstraction facilitating mathematical analysis of the performance of the repair regulator. Embodiments may provide for various versions of update times, such as depending upon the particular analysis done by the repair regulator logic. Irrespective of the particular implementation of repair regulator logic, embodiments herein may nevertheless attempt to balance several conflicting goals. For example, embodiments operate to smooth repair bandwidth (e.g., avoiding large fluctuations in requested repair traffic), while providing efficient repair operation (e.g., a relatively large number of missing fragments are recovered upon source object repair), while also avoiding data loss (e.g., the integrity and recoverability of source objects is maintained with very high probability).

In deriving repair regulator logic of embodiments, it may be assumed that storage node failures are exponentially distributed with parameter $\lambda$ (e.g., storage node failures are a Poisson process with rate $\lambda \cdot n$). The repair regulator implemented according to embodiments is, however, adapted to be robust against deviation from this assumption.

As a general principle in the operation of repair bandwidth control according to embodiments, the repair regulator logic (e.g., repair regulator logic 256) will generate a repair rate preference (e.g., in the form of a desired source object repair time) for each object in the repair queue (e.g., repair queue 254), wherein a source object's repair rate preference is determined so that if that repair rate were applied by a repair policy (e.g., lazy repair policy 252) to all of the source objects ahead in the repair queue of the source object for which the preferred rate was determined, then this rate would best meet the source object's repair objectives (e.g., best achieve the desired trade-off between repair efficiency and low probability of excessive fragment loss for that object). The repair regulator logic of embodiments has the position in the repair queue of each such source object, and thus can calculate the total repair work that must be accomplished before the respective source object is repaired. The repair regulator logic of embodiments also has knowledge of the current number of missing fragments for each such source object. Embodiments of repair regulator logic may have access to an estimate or estimates of the node failure rate (e.g., as may be provided by failure estimator logic 257). In operation, the repair regulator logic bases the repair rate preference for each source object on one or more respective pieces of the foregoing information. Repair bandwidth control logic of embodiments operates to choose a repair rate as the repair rate to be applied (e.g., by lazy repair policy 252) with respect to the repair queue based on the repair rate preferences for all of the source objects. For example, repair bandwidth control logic may operate to select the fastest repair rate preference (i.e., the repair rate preference that repairs source objects in the least amount of time) among the repair rate preferences for all of the source objects, such as in a storage system implementation that places reliable retention of all data as the first priority and repair efficiency and smoothness as secondary. In some embodiments, repaired bandwidth control logic may operate to select a repair rate based on repair rate preferences for only a subset (not all) of the source objects.

For a repair rate determination process of repair regulator logic as may be implemented according to embodiments, a function $\Phi:[0:\mathcal{O}-1]\times[1:n]\to\mathbb{R}^+$ may be defined, such that for a source object in position L with F missing fragments a repair time of $\lambda^{-1}\cdot\Phi(L,F)$ is preferred, where $\lambda$ is the single node loss rate. It should be appreciated that, if the repair regulator logic process permanently selects the foregoing repair time, then the respective source object will be repaired after time $(\mathcal{O}-L)\cdot(\lambda^{-1}\cdot\Phi)(F,L))$. Under a Poisson model the distribution of the number of missing fragments upon repair is determined by F, $\lambda$, and the foregoing repair time. Thus, $\Phi$ reflects the preferred properties of this distribution. Repair bandwidth control of embodiments may operate to choose the repair time for the repair regulator logic process as the minimum of the preferred repair times:

$$\min_{L\in\lfloor 0:\mathcal{O}-1\rfloor} \lambda^{-1}\Phi(F(L),L) \quad (1)$$

where F(L) denotes the number of erased fragments for the object in position L.

More generally, when the size of source objects differ, the function $\Phi$ may be defined, such that for a source object in position L with F missing fragments and assuming a nominal source object size of N, a repair time of $\lambda^{-1}\cdot\Phi(F,L)$ is estimated for a source object of size N, where $\lambda$, is the single node loss rate. It should be appreciated that, if the repair regulator logic process permanently selects the foregoing repair time, then the respective source object will be repaired after time $\lambda^{-1}\cdot\Phi(F,L)/N$ times the total size of objects in the repair queue subsequent to the source object.

In accordance with some embodiments, an exact value of $\lambda$, may not be known, and the value of $\lambda$, may vary over time. Thus, $\lambda$ in equation (1) above may be replaced with an estimate $\hat{\lambda}$ that may depend on F and L, as discussed in further detail with respect to failure estimator logic of embodiments.

Consider a source object in the repair queue at some point in time $t_0$ with F missing fragments. Under the Poisson assumption, the rate at which additional fragments are being lost is $\lambda\cdot(N-F)$. At time $t_0+t$, assuming the source object has not yet been repaired, the number $F'\geq F$ of missing fragments for this source object is a random variable with the following binomial distribution:

$$q_{\lambda t}(F'\mid F) = \binom{N-F}{F'-F}(e^{-\lambda t})^{n-F'}(1-e^{-\gamma t})^{F'-F}.$$

Assuming that the source object will be repaired at time $t_0+T$, the expected number of erased fragments upon repair is $M(F,\lambda T):=F+(n-F)\cdot(1-e^{-\lambda T})$ and the variance in the number of missing fragments upon repair is $V(F,\lambda T):=(n-F)\cdot e^{-\lambda T}(1-e^{-\lambda T})$.

It is convenient to focus on the large system limit and to work with continuous variables. Accordingly, the following normalized variables are introduced:

f=F/n;
m(f,$\lambda$T)=M(F,$\lambda$T)/n;
v(f,$\lambda$T)=V(F,$\lambda$T)/n.

Introducing the notation $\bar{f}=1-f$, provides:

$$\bar{m}(f, \lambda T) := \bar{f} \cdot e^{-\lambda T}$$

$$v(f, \lambda T) := \bar{f} \cdot e^{-\lambda T} \cdot (1 - e^{-\lambda T}).$$

The notation $x=L/\mathcal{O}$ may be introduced to represent relative position of the source object in position L of the repair queue. In general, when source object sizes differ, x may represent the relative position of a source object in position L, where x is the total size of source objects queued behind the source object in position L divided by total size of all $\mathcal{O}$ source objects.

When source object o enters the repair queue at time $\tau_o$, the source object has zero missing fragments. In operation according to embodiments, when a failed storage node is replaced, the replacement storage node is identified with the storage node it has replaced (e.g., reusing the ESI of the failed storage node). If the replacement storage node subsequently also fails, then only those source objects that were repaired after the replacement storage node entered the storage system will incur a fragment erasure. To help capture this effect in the analysis, the notation $F_{Dis}$ [a, b] is introduced to denote the number of distinct storage node failures in the interval [a, b], (i.e., storage nodes that store fragments associated with distinct ESIs). The total number of storage node failures in the same interval may be denoted as $F_{Tot}$ [a, b]. As an example, if there are two storage nodes with associated ESI I that fail within the time interval [a, b) then the two failures contribute one to $F_{Dis}$ [a, b] and contribute two to $F_{Tot}$ [a, b] (e.g., the second node may be a replacement for the first node.) At time $t \geq \tau_o$ the number of missing fragments for a source object that entered the repair queue at time $\tau_o$ is $F_o(t) = nf_o(t) = F_{Dis}[\tau_o, t]$.

In a steady state/mean trajectory heuristic repair regulator design according to embodiments, in addition to the aforementioned assumption of a fixed node failure arrival rate $\lambda$, a fixed object processing rate may further be assumed. In the large (n and $\mathcal{O}$) system limit, the behavior of the repair queue concentrates around its mean and the normalized variables become continuous. Let $f_0(t)$, $x_0(t)$ represent the trajectory of a source object o with $\tau_o = 0$ as it advances through the repair queue, whereby the source object is tracked as it advances through the repair queue. Under the fixed processing rate assumption, $$\frac{d}{dt} x_0(t) = \text{constant.}$$

If at time $\tau$ a source object has 0 missing fragments then the expected number of available fragments at time $t \geq \tau$ (assuming no repair has occurred) is $\mathbb{E}^-f(t)n$, where $\mathbb{E}^-f(t) = 1 - n^{-1}\mathbb{E}(F_{Dis}[\tau, t]) = e^{-\lambda(t-\tau)}$. If $T_{Target}$ represents the waiting time before repair (e.g., the time between successive repairs of a fixed object), then a source object will have an expected $f_{Target} \cdot n$ erased fragments upon repair, where $\bar{f}_{Target} = \bar{m}(0, \lambda T_{Target}) = e^{-\lambda T_{Target}}$. If $f_{Target}$ is specified as the desired expected fraction of fragments recovered upon repair, then the above equation determines $T_{Target}$, and thus the repair rate. Since $x(\tau_o) = 0$ for source object o, $x(t) = (t - \tau_0)T_{Target}$. The expected number of missing fragments, $\bar{f}_{nom}(x)$, for any source object in relative position x is then given by $f_{nom}(x) = e^{-\lambda T_{Target} x}$. This repair trajectory may be referred to as the nominal repair trajectory.

Consider a source object on the foregoing nominal repair trajectory at relative position x with $\bar{f}_{nom}(x)$ missing fragments. For this source object the time until repair T may be given by $T = T_{Target}(1-x)$, whereby $m(f_{nom}(x), T_{Target}(1-x)) = f_{Target}$. The variance $v(f_{nom}(x), T_{Target}(1-x))$ n in the number of recovered fragments in this case may be given by $v_{nom}(x) := v(f_{nom}(x), \lambda T_{Target}(1-x)) = f_{nom}(x)(1 - e^{-\lambda T_{Target}(1-x)}) = f_{Target}(1 - e^{-\lambda T_{Target}(1-x)})$, which is a decreasing function of x for $x \in [0,1)$. Thus, when a source object follows the nominal repair trajectory the variance in the number of recovered fragments upon repair is decreasing.

Assume the existence of an additional target $f_T \cdot n > f_{Target} \cdot n$ which represents the maximal number of missing fragments that can be tolerated (e.g., without loss of data). For example, under an MDS code assumption, $f_T = (n-k+1)/n$ may be chosen. When the erasure code is not MDS, or when other system considerations favor larger numbers of available fragments, $f_T$ may be chosen smaller. A source object on the nominal repair trajectory in relative position x anticipates $S(x)\sqrt{n}$ standard deviations of protection from hitting $f_T \cdot n$ erased fragments upon repair where $$S(x) = \frac{f_T - f_{Target}}{\sqrt{v_{nom}(x)}} \tag{2}$$

Accordingly, in operation of a repair policy in accordance with embodiments herein, the repair regulator logic, for a source object at relative position x in the repair queue with $f < f_T$, determines a preferred repair rate such that under that rate of repair the respective source object anticipates $S(x) \cdot n$ standard deviations of protection from hitting $f_T \cdot n$ missing fragments upon repair. Under this policy, if a source object at position x had the nominal fragment loss $\bar{f}_{nom}(x) = e^{-\lambda T_{Target} x}$ then its estimated repair rate will be the nominal repair rate $$\left(e.g., \frac{d}{dt}x(t) = \frac{1}{T_{Target}}\right).$$

If, however, a source object is "above" the nominal repair trajectory (i.e., the source object has $f > 1 - e^{-\lambda T_{Target} x}$) then a shorter repair time will be preferred by the repair regulator logic of embodiments. Correspondingly, if a source object is "below" the nominal repair trajectory (i.e., the source object has $f < 1 - e^{-\lambda T_{Target} x}$) then a longer repair time will be preferred by the repair regulator logic of embodiments.

It should be appreciated that, in practice, there will be a non-zero minimum repair time. The foregoing policy may be extended according to embodiments to $f \geq f_T$ by having the repair regulator logic prefer the minimum repair time for source objects in such a condition.

In implementing an exemplary repair regulator logic according to the foregoing, assume the target fraction of missing fragments ($f_{Target}$) and the fragment loss threshold value ($f_T$) are given (e.g., selected to provide a desired balance between fragment losses being low enough for a high probability of data recovery and the number of fragments generated by the repair being large enough to result in suitable repair efficiency). Given $x \in [0,1)$ and $f < f_T$, the function $\Phi(f,x)$ may be defined as the unique solution to $$\frac{f_T - m(f, (1-x)\phi(f, x))}{\sqrt{v(f, (1-x)\phi(f, x))}} = \frac{f_T - f_{Target}}{\sqrt{v(f_{nom}(x), (1-x)\lambda T_{Target})}} (=: S(x)). \tag{3}$$

Equation (3) can be solved in closed form by squaring both sides. It should be appreciated that the form of the function v is based on a second order approximation and is not essential. The appropriate interpretation of φ(f,x) is a time to repair the entire source object set normalized by node failure rate, and thus is an expected fractions of node failures in a time period required to repair all source objects.

From the foregoing, the corresponding preferred repair time per source object may be defined as:

$$\Phi(F,L) = \mathcal{O}^{-1} \varphi(F/n, L/\mathcal{O}) \quad (5)$$

Accordingly, equation (5) may provide the preferred repair rate as determined by repair regulator logic for respective source objects in a repair queue, according to embodiments herein.

In operation according to embodiments, when the repair regulator logic determines a repair rate preference for a source object it is implicitly targeting an expected number of recovered fragments upon repair of $\bar{f}_e := \bar{m}(f, (1-x)\varphi(f,x)) = \bar{f} e^{-\varphi(f,x)(1-x)}$. Thus, $\upsilon(f,(1-x)\varphi(f,x)) = \bar{f}_e(1 - e^{-(1-x)\varphi(f,x)})$ and equation (3) may be written as $$\frac{\bar{f}_e - \bar{f}_T}{\bar{f}_{Target} - \bar{f}_T} \sqrt{\frac{\bar{f}_{Target}}{\bar{f}_e}} = \sqrt{\frac{(1 - e^{-(1-x)\phi(f,x)})}{(1 - e^{-(1-x)\lambda T_{Target}})}} \quad (4)$$

It should be appreciated that for all $f \in [0, f_T]$ and $x \in [0, 1)$ equation (4) has a unique solution φ (f,x) satisfying the following properties:
A. φ(f,x) is decreasing in f for fixed x;
B. φ(f,x) is increasing in x for fixed f;
C.

$$\phi(f, x) \in \left[0, -\ln(\bar{f}_{Target}) \frac{f_T}{\bar{f}_{Target} - \bar{f}_T} \sqrt{\bar{f}_{Target}}\right];$$

D. There exists positive constants $\underline{c}$ and $\overline{c}$ such that $$\underline{c} \leq \frac{(f_t - f_e)^2}{\phi(f, x)} \leq \overline{c};$$

and
E. There exists positive constants $\underline{C}$ and $\overline{C}$ such that $$\underline{C} \leq \frac{(f_T - f)^2}{\phi(f, x)} \leq \overline{C}.$$

In the large system limit, various curves of interest may be extracted from the definitions above. For example, a constant-rate curve, comprising a curve (x,f(x)) so that φ(x,f(x))=constant, may be extracted. Additionally, self-governing mean trajectories, providing solutions (x(t),f(t)) to $$\frac{d}{dt}\bar{f} = -\lambda \bar{f} \text{ and } \frac{d}{dt}x(t) = \frac{1}{\phi(x(t), f(t))}$$

may be extracted. A constant-target curve, comprising the points (x,f(x)) so that $f_e(x,f(x))$=constant, may likewise be extracted. It should be appreciated that the aforementioned nominal repair trajectory may satisfy the definition for all three of the above curves. For most practical choices for the parameters, all three of these extracted curves are very similar and, with a slight modification of the definition of v, the three curves become identical in all cases. In particular, if one replaces $v(f,\tau)=(\bar{f}e^{-\tau})(1-e^{-\tau})$ with $v(f,\tau):=(\bar{f}e^{-\tau})(\tau)$, then all three curves above coincide. This alternate definition of v approximates the original quite well for small τ and the practical effect of this change is negligible if $-\ln(1-f_{Target})$ is small. With this alteration equation (6) simplifies to $$\frac{(\bar{f}_e - \bar{f}_T)}{(\bar{f}_{Target} - \bar{f}_T)} \cdot \sqrt{\frac{\bar{f}_{Target}}{\bar{f}_e}} = \sqrt{\frac{\phi(x, f)}{-\ln(\bar{f}_{Target})}}$$

wherein it can be seen that a fixed $f_e$ corresponds to a fixed φ. It should be appreciated that the repair trajectories shown in FIG. 4 represent examples of the aforementioned mean trajectories for a particular system.

Figure 6:
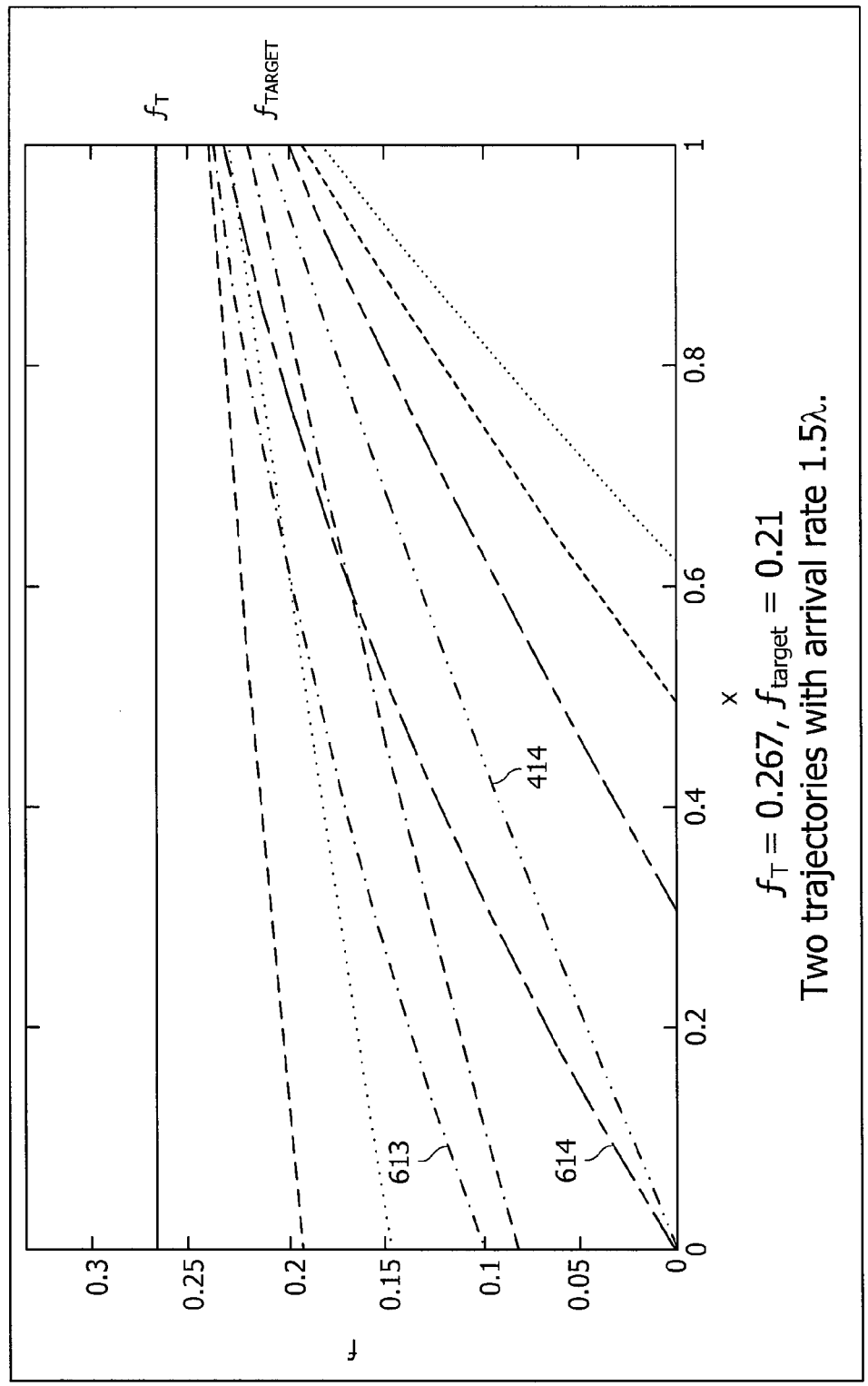
FIG. 6 shows graphs of various repair trajectories where a failure rate mismatch is experienced according to embodiments of the present disclosure.

As previously mentioned, the storage node failure rate may be different than an assumed or estimated storage node failure rate. Accordingly, FIG. 6 shows repair trajectories where such a failure rate mismatch is experienced (e.g., the storage node failure arrival rate is different from the assumed storage node failure rate). As can be seen in the illustration of FIG. 6, even the failure rate mismatch repair trajectories (i.e., failure rate mismatch repair rate trajectories 613 and 614) continue to converge around the nominal repair rate trajectory (i.e., repair rate trajectory 414), and thus provide repair of source objects at points when approximately the target number of fragments, $f_{Target}$, are missing (and in each case prior to the fragment loss threshold value, $f_T$, having been reached).

In the above example, a nominal storage node failure arrival rate of λ·n and a Poisson failure process were assumed. However, as previously mentioned, the storage node failure process may be more complicated in practice. Thus, embodiments may view λ, as unknown or time varying. The repair regulator of embodiments may thus utilize an estimate of λ.

Since λ may in fact be time varying, and an operational goal of embodiments is to avoid reaching $f_T$·n missing fragments prior to source object repair, embodiments of failure estimator logic (e.g., failure estimator logic 257) operable with the repair regulator logic (e.g., repair regulator logic 256) may estimate λ, for a source object with f·n missing fragments, based on the failure process over a time scale corresponding to the time for the most recent $(f_T-f)$·n storage node failures. Further detail with respect to estimating the storage node failure rate according to embodiments is provided below in the context of a deterministic analysis wherein node failure arrival is treated as a deterministic function of time.

As previously discussed, the analysis of the repair queue and associated implementation of a selected repair rate may be implemented continuously, periodically, upon the occurrence of an event, etc. In determining a frequency at which to implement the forgoing analysis and repair rate selection, it is helpful to analyze the repair queue distribution. Given a Poisson node failure process of known rate X, the repair system state can be characterized by the function F(L) giving the number of missing fragments for source objects as a function of their position and the fraction of repair completed on the source object at the head of the repair queue. Restricting the foregoing to times when repairs are completed, then F(L) determines the complete state. That is, the future repair trajectory of the system is completely determined by F(L) and future failure arrivals. In general the fractional repair of the source object at the head of the repair queue should be considered part of the state. In the case where estimates of X are also used to govern the system, then the state also encompasses any information required to determine those estimates going forward in time.

In determining at what points in time to modify the source object repair rate in accordance with embodiments herein, it should be appreciated that such repair rate adjustment can in principle be done continuously. Such a continuous repair rate adjustment scheme simplifies the analysis of some of the bounds discussed below. However, in practice the repair rate adjustments/updates implemented according to embodiments may be driven by events, such as source object repair and storage node failure.

Practical analysis of the repair queue distribution leads to a steady state analysis (e.g., invariant distribution of the queue state). Bounds on MTTDL (e.g., which assumes initialization in a complete loss-free state) may be derived from such a steady state repair queue distribution.

In deriving bounds on MTTDL according to embodiments, assume that the storage system is initiated with all source objects complete (F(L)=0) and that data loss occurs when greater than $f_T \cdot n$ fragments for a source object are missing, wherein the MTTDL is the expected time until some source object has greater than $f_T$ missing fragments. This corresponds to the event that a storage node failure occurs and the number of erased fragments of the source object in position $\mathcal{O}-1$ increases from $f_T \cdot n$ to $f_{T_n} \cdot +1$. Since the source object in position $\mathcal{O}-1$ has the maximal number of missing fragments among all source objects, the distribution of the number of missing fragments for source objects in this position is particularly important.

It should be appreciated that the analysis according to embodiments herein exploits a self-governing approximation. In this approximation the trajectory of a particular source object is tracked through the repair queue under the assumption that the object repair time is determined by and for that tracked source object. If the repair rate is updated continuously, then the approximation is strictly conservative in the sense that for a given storage node failure realization the self-governed approximation is closer to the tail of the queue than the actual source object would be. Additionally or alternatively, embodiments provide for various discrete repair rate update strategies, as may be desirable both for greater practicality and because such strategies can be used to compute steady state repair queue distributions and obtain bounds on MTTDL.

In providing for continuous updating of the repair rate according to embodiments, it is helpful to recall the notion of fractional position in the repair queue. With such a fractional position in the repair queue, the position L in the repair queue will not be restricted to integer values, but will instead be continuous valued. Accordingly, equation (1) may be replaced with the following differential equation that applies to each object o in the repair queue $$\frac{d}{dt}L_0(t) = \left( \min_{L \in [0:\mathcal{O}-1]} \lambda^{-1} \Phi(F(L), L) \right)^{-1} \quad (7)$$

The initial condition for source object o is given by $L_o(\tau_o)=0$. It should be appreciated that, in this form of the system, the quantity on the right can change in value upon source object repair and upon storage node failures. Further, the quantities on the right are time dependent, although that dependence has been suppressed in the notation. The position of source object o in the repair queue at time t is $\lfloor L_o(t) \rfloor$.

In a continuous repair rate update implementation, consider a source object o that enters the repair queue at time $\tau_o$. Assume that $\Phi(F,L)$ is non-increasing in L for fixed F. Let $\tilde{L}_o(t)$ be the (self-governing) solution to $$\frac{d}{dt}\tilde{L}_0(t) = \left( \lambda^{-1} \Phi(F_{Dis}[\tau_0, t] \cdot \lfloor \tilde{L}_0(t) \rfloor) \right)^{-1} \quad (8)$$

A mathematical analysis of these equations shows that $\tilde{L}_0(t) \le L_0(t)$. This means that the self-governing approximation is conservative in the sense the a source object will be repaired sooner than predicted by the self-governing approximation. The approximation can be used to bound performance of the repair strategy and obtain estimates of key performance metrics such as MTTDL.

It is possible to show that the above analysis is robust if the continuous update assumption is relaxed. In particular consider updating the repair rate upon source object repair according to embodiments, assume a known storage node failure arrival rate $\lambda$ and update of repair time upon source object repair. Upon source object repair the time for the next source object repair is given by $$L \in \min_{[0:\mathcal{O}-1]} \lambda^{-1} \Phi(F(L), L) \quad (11)$$

It should be appreciated that, in this exemplary case, there is no need for continuous repair queue position. An analysis analogous to the foregoing in which updates are performed upon object repair is provided below.

Consider a source object with F failures in position L at the beginning of the source object repair processing period. Given that the time to repair the next source object is $\mathbb{E}t$ and the storage node failure rate is $\lambda$, the distribution at the end of the repair processing period, which corresponds to the distribution in position L+1 at the beginning of the next source object repair processing period, is for $F' \ge F$ given by $$q_{\lambda\delta t}(F' \mid F) = \binom{n-F}{F'-F}(e^{-\lambda\delta t})^{n-F'}(1-e^{-\lambda\delta t})^{F'-F}$$

It should be appreciated that, if this source object were the one determining the minimum in the repair policy and the preceding repair had just occurred, then $\lambda\delta t = \Phi(F, L-1)$.

Let $P_L(F)$ denote the steady state probability that a source object has F missing fragments upon reaching position L in the repair queue, wherein $P_\mathcal{O}(F)$ is the distribution of the number of repaired fragments upon repair. Define $Q_0(F)=1\{F=0\}$ and for $L \in \{1,2,\ldots,\mathcal{O}\}$ define $$Q_L(F') = \sum_{F=0}^{n} q_{\Phi(F,L-1)}(F' \mid F) Q_{L-1}(F). \quad (12)$$

The distribution $Q_L(F)$ can be interpreted as the distribution of the number of missing fragments for a source object arriving in position L, assuming that the referenced source object determined the repair rate since it entered the repair queue (e.g., that source object gave the minimum in equation (11) at each prior position in the repair queue.

Now consider an arbitrary starting queue state and a source object o entering the repair queue at position 0 at time $\tau_o$, which can be taken to be 0. Let $\delta t$ represent the source object repair time while the tracked source object is in position L and let $t_L = \tau_0 + \Sigma_{i=0}^{L-1} \delta t_i$ denote the time that the source object arrives in position L. Thus, F(L), the number of erased fragments when the source object reaches position L, is $F_{Dis}[0, t_L)$, wherein the tracked source object is repaired at time $t^{\mathcal{O}}$.

Further consider a pseudo repair trajectory for the same source object and the same storage node failure realization under the assumption that the source object determines the minimum in equation (11). Let $\tilde{t}_0 = 0$ and $\tilde{F}(0) = 0$ and for L=0, ..., $\mathcal{O}$ −1 define recursively $$\delta \tilde{t}_L = \lambda^{-1} \Phi(F_{Dis}[\tau_0, \tilde{t}_L), L)$$
$$\tilde{t}_{L+1} = \tilde{t}_L + \delta \tilde{t}_L \quad (13)$$

This system represents a pseudo repair process corresponding to the distribution Q according to embodiments. It is said to be "pseudo" because the repair times $\tilde{t}_L$ are not the repair times that would normally actually occur. Unlike in the continuous case discussed above, here it possible to have $\tilde{t}_L < t_L$ due to delayed reaction to storage node failure. This passing of the actual process by the pseudo process is, however, limited. It can be mathematically demonstrated that is $\Phi(F,L)$ is non-increasing in F for fixed L and $t_L - \tilde{t}_L > 0$, then the gap can only decrease, i.e., $t_{L+1} - \tilde{t}_{L+1} \leq t_L - \tilde{t}_L$. Hence the relaxation from the continuous case is slight.

It should be appreciated that the monotonicity assumption on $\Phi$ would be satisfied in any practical solution. Since $\tilde{t}_0 = t_0 = \tau_0$ the foregoing shows that the pseudo repair process can never lead the actual repair in time by an amount larger than $$G := \lambda^{-1} \max_L \left( \max_F \Phi(F, L) - \min_F \Phi(F, L) \right) \quad (40)$$

If $\Phi$ is bounded above, then this tends to 0 in the limit of infinitely many source objects. Alternatively, the term vanishes if instantaneous update of the repair rate upon storage node failure is assumed, rather than updating only upon source object repair completion.

Equation (13) may be extended to L=$\mathcal{O}$+1 by setting $\delta \tilde{t}_o = G$. Then $\tilde{F}(\mathcal{O}+1) \geq F(\mathcal{O})$. By integrating over the distribution of storage node failure arrivals, the extension of equation (13) to L=$\mathcal{O}$+1 by setting $\lambda^{-1}\Phi(F, \mathcal{O}) - G$ provides $$\sum_{F=i}^{N} Q_{\mathcal{O}+1}(F) \geq \sum_{F=i}^{N} P_{\mathcal{O}}(F)$$

Graph 503 in FIG. 5 that is a bound on the distribution $P_{\mathcal{O}}(F)$ was calculated based on the foregoing analysis. In the constant repair rate case $\Phi$=constant and $\mathcal{O}_L(F) = P_L(F)$. The foregoing may be used to obtain a bound on MTTDL according to embodiments.

For embodiments of a repair regulator that involve estimation of $\lambda$, alternate forms of the above described bound may also be developed. The analysis in this case is simpler if updating the repair rate upon storage node failure according to embodiments is considered, i.e., the repair rate is updated at storage node failure times rather than at source object repair times. Computed bounds based on this approach can more simply lead to bounds on MTTDL, even incorporating storage node failure arrival rate estimation than the update upon object repair policy. There are two basic cases of failure update discussed herein (referred to as fragment erasure updating and node failure updating) depending on whether for failure rate estimation for a given source object all storage node failures are considered or only those that cause fragment loss for that source object.

In considering the fragment erasure updating case, assume the infinite number of source objects limit and ignore effects due to finite size source objects. Since source objects may be subdivided for repair purposes, this limit is essentially equivalent to a continuous position update. Nevertheless, the notation of a discrete set of positions in the repair queue will continue to be used with respect to the fragment erasure updating of embodiments.

Given that a source object in the repair queue has F missing fragments, the time to the next distinct storage node failure (i.e., a storage node that can increase the number of missing fragments to F+1) is exponentially distributed with rate $\lambda(n-F)$. Assume that the source object has just arrived at position L. Let t denote the time until the next fragment loss. Then, assuming that the repair rate is determined for the tracked source object, the source object will be in position L' if t is in the interval $[\lambda^{-1}\Phi_L^{L'}(F), \lambda^{-1}\Phi_L^{L'+1}(F))$ where $\Phi_L^{L'}(F) = \Sigma_{i=L}^{L'} \Phi(F,i)$. The probability of t falling in this interval is $e^{-(n-F)\Phi_L^{L'}(F)} - e^{-(n-F)\Phi_L^{L'+1}(F)}$. The source object is repaired prior to the next fragment loss if $t \geq \Phi_L^{\mathcal{O}}(F)$. It should be appreciated that, since source object repairs and storage node failures are not synchronized, the time t will not coincide with a source object repair except in the limit of infinitely many source objects.

Define $Q_0(0) = 1$ and for F≥0 define $$Q_{F+1}(L') = \sum_{L \leq L'} \left( e^{-(n-F)\Phi_L^{L'+1}(F)} - e^{-(n-F)\Phi_L^{L'}(F)} \right) Q_F(L).$$

In the foregoing, Q represents the distribution for a source object under the assumption that it determines the repair rate at each step. Let $P_F(L)$ denote the distribution on L for a source object when it first reaches F missing fragments.

In the infinite number of source objects limit, for each F, $$\sum_{k=0}^{L} Q_F(L) \geq \sum_{k=0}^{L} P_F(L)$$

This result can be demonstrated much as in the continuous update case.

In considering the storage node failure updating case, as a source object is tracked through the repair queue the total number of storage node failures it observes (e.g., the total number of storage node failures since the source object entered the queue) may be denoted by the quantity $F^{all}$). The probability distribution of F given $F^{all}$ can be calculated recursively:

$$p(F \mid F^{all}) = \frac{n-F+1}{N} p(F-1 \mid F^{all} - 1) + \frac{F}{N} p(F \mid F^{all} - 1)$$

-continued with $$p(F = 0 \mid F^{all} = 0) = 1.$$

The definition of Q can be extended to include dependence on $F^{all}$. Given $Q(F^{all}, F, L)$, define $$\delta Q(F^{all}, F, L') = \sum_{L \leq L} e^{-n\Phi_L^{L'+1}(F)} - e^{-n\Phi_L^{L'}(F)}$$

then $$Q(F^{all}, F, L) = \frac{n-F+1}{n} \delta Q(F^{all}-1, F-1, L) + \frac{F}{n} \delta Q(F^{all}-1, F, L).$$

The foregoing two forms admit different extensions of the analysis involving estimates of $\lambda$ according to embodiments. It should be appreciated that, although the storage node failure updating approach appears more complicated than the fragment erasure updating approach, the storage node failure updating approach has the advantage that the related estimates need not be source object dependent.

The above discussed bounds may be extended to the case where $\lambda$ is estimated and not assumed known and may be time-varying. Accordingly, estimation schemes based on the inter-arrival times of storage node failures are considered. For example, assume a source object has an associated estimate $\hat{T}$ for storage node failure interarrival times. The expected value of this under the Poisson assumption is $(\lambda \cdot n)^{-1}$. Some forms for the storage node failure rate estimates with respect to the aforementioned fragment erasure updating case and storage node failure updating case that lead to tractable computation of bounds on MTTDL are described below. In the examples, the estimates depend on the storage node failure realization and the value of F. However, other forms of estimators may be considered and some are described below in the context of a deterministic analysis of embodiments.

For the fragment erasure updating case, assume the source object has F missing fragments. Then the time to the next fragment loss is exponentially distributed with rate $\lambda(n-F)$. Where the observed time is T, consider an update of $\hat{T}$ of the form $$\hat{T} \leftarrow \alpha \hat{T} + \bar{\alpha} \frac{n-F}{n} T. \quad (14)$$

In general, $\alpha$ is allowed to depend on F according to embodiments. In most cases $\alpha$ is expected to be quite small. This is a first order filter on the interarrival times of fragment loss, scaled to represent the storage node failure rate.

For the storage node failure updating case, assume the source object has observed $F^{all}$ storage node failures since entering the repair queue. Then the time to the next storage node failure is exponentially distributed with rate $\lambda$n. Where the observed time is T, consider an update of $\hat{T}$ of the form $$\hat{T} \leftarrow \alpha \hat{T} + \bar{\alpha} T \quad (15)$$

In general, $\alpha$ is allowed to depend on F according to embodiments. In most cases $\alpha$ is expected to be quite small. Both of the above estimators are formed by taking arithmetic averages of storage node failure inter-arrival times. Those skilled in the art will recognize that many other possibilities exist, including taking geometric means, which is equivalent to forming an arithmetic average of the logarithm of the inter-arrival times. Besides using the logarithm many other functions may be suitable and the use of any such estimation is a possible embodiment of the repair bandwidth regulator.

Consider again a source object in the repair queue at position L with F missing fragments and an estimate $\hat{T}$ for the expected storage node failure interarrival time, assume that a fragment has just been lost and consider the time T until the next fragment loss. Upon the next storage node failure the estimate $\hat{T}$ is updated according to equation (15) or (14) (depending on whether a fragment loss occurred) and L is updated L', where $$T \in [\hat{T}n\Phi_L^{L'}(F), \hat{T}n\Phi_L^{L'+1}(F)),$$

according to embodiments. This update may be used together with the update in position to obtain the self-governed distribution jointly for position in the queue and for the estimated failure arrival rate. Bounds such as graph 503 in FIG. 5 may thus be computed that also incorporate the estimation of failure arrival rate. These schemes can also be generalized to allow $\alpha$ to depend on F thus allowing the effective averaging window used for the estimate of $\hat{T}$ to depend on F. Practical implementations of the same idea, which are however more difficult to analyze, include windowed averaging where $\hat{T}$ is formed as an average of storage node failure interarrival times taking some number of previous storage node failures into account. The number of failures taken into account can depend on F. Embodiments may use a smaller effective window (number of previous failures) for those source objects with larger numbers of erased fragments.

As discussed above, the storage node failure rate in practice may not be a fixed rate (e.g., as modeled by a Poisson process), accordingly a time varying model for estimating storage node failure rates may be more appropriate in practice. The repair regulator (e.g., repair regulator logic 256) of embodiments may thus utilize an estimate of $\lambda$ (e.g., as provided by failure estimator logic 257), as described above. Various techniques may be implemented for providing suitable storage node failure rate estimates for particular embodiments herein. Once an estimator for $\lambda$ has been fixed, the behavior of the repair regulator of embodiments may be considered for particular realizations of the failure arrival process. This consideration can be used to compare various possible choices for the estimator. Accordingly, an analysis technique can be used in which the storage node failure arrival process is modelled in a deterministic fashion leading to a deterministic dynamical system model n of the repair process and queue. Such a model can be used to examine conditions that could potentially lead to system failure (e.g., exceeding $f_T \cdot n$ missing fragments in a source object). For example, system failure may result where the estimator of the storage node failure arrival rate responds too slowly to an upsurge in the storage node failure rate. Examining such conditions can afford a comparison of the performance of different forms for the storage node failure rate estimator. As can be seen from the deterministic model that follows, the storage node failure arrival rate would need to be unbounded (i.e., tend to $\infty$) for system failure where repair bandwidth control is provided according to embodiments herein. Although such an unbounded storage node failure arrival rate is unlikely in practice, embodiments herein may nevertheless remediate the possibility by adapting the failure estimator logic to provide estimates $(\hat{\lambda})$ correspondingly tending to ∞ so that system failure cannot occur without prior detection of the accelerated failure process.

In a deterministic model for storage node failure estimation according to embodiments, consider storage node failure arrival times to be a sequence $\tau_0, \tau_1, \ldots$ and define the function $n\lambda(t)$ as $$\frac{1}{\tau_{i+1} - \tau_i}$$

for $t \in [\tau_i, \tau_{i+1})$. Then $\lfloor n\int_0^t \lambda(u)du \rfloor$ is a count of the storage node failures from 0 to t. In the Poisson arrival case, with fixed rate $\lambda$, this will concentrate around $n \cdot \lambda \cdot t$ for large t.

For the resulting deterministic model for the storage system of embodiments, assume a failure arrival function $\lambda(t)$, as above which, which is assumed to be a positive function of appropriate regularity. For $t \geq \tau_o$, define $f_o(t)$ as the solution to $$\frac{d}{dt}f_0(t) = (1 - f_0(t))\lambda(t) \quad (16)$$

with $f_o(\tau_o)=0$. It should be appreciated that, although the storage node failure arrivals have been represented explicitly, the distinct storage node failures are nevertheless being modeled (by their expected value. The process of distinct storage node failures could additionally or alternatively be defined explicitly, such as in embodiments which largely depend on a self-governed analysis where little would change except the notation. Continuing, however, with the representation provided by equation (16), the equation can be written as $$\frac{d}{dt}\ln \overline{f}_0(t) = -\lambda(t),$$

and thus the solution $$\overline{f}_0(t) = e^{-\int_{\tau_0}^t \lambda(u)du}$$

may be obtained.

Embodiments of a deterministic technique for failure estimation work with a time scale adapted to the storage node failure arrival process. Accordingly, define $s=s(t)=\int_0^t \Delta(u)\,du$. In understanding the discussion which follows, it should be understood that notation changes with respect to the variables, from t to s, have been made for simplifying certain expressions (e.g., in order to write $\lambda(s)$ for $\lambda(t(s))$. The above solution for $\bar{f}$ can be written as $\bar{f}_0(s)=e^{s_o-s}$ (introducing the notation $s_o=s(\tau_o)$).

With respect to the relative queue position ($x_o$) of a source object, if a source object o is in the repair queue then $$\frac{d}{dt}x_0(t) = \sup_{x \in [0, 1)} \frac{\hat{\lambda}(t)}{\phi(f(x), x)}. \quad (17)$$

In the foregoing, it is implicitly assumed that $\hat{\lambda}(t)$ is independent of the source object, and thus independent of x, although the need not be the case. Under the self-governed assumption of embodiments the supremum is given by $x=x_o$ and this distinction is immaterial.

Various embodiments of failure estimators illustrated using the concepts of a deterministic model as described herein are provided below. For example, embodiments of a failure estimator as may be implemented by failure estimator logic 257 may comprise a first order filter configurations, failure arrival windowed filtering configurations, adaptive windowing configurations, etc.

In providing a failure estimator according to the concepts herein, it should be appreciated that a system failure occurs if $f_o(t)=f_T$ and $x_o(t)<1$ for some source object o and $t \geq \tau_o$. In the self-governing analytical approximation of embodiments, the system failure may be simplified to the (first) failing object, wherein for notational simplicity this may be taken to be a fixed source object o with $\tau_o=0$. The conditions under which the foregoing system failure can occur may be determined as described in the following.

Expressing the dynamics of the repair queue in the s time scale provides $$\frac{d}{dt}x_0(s) = \sup_{x \in [0, 1)} \frac{\hat{\lambda}(t(s))}{\hat{\lambda}(t(s))} \frac{1}{\phi(f(x), x)}. \quad (18)$$

The storage node failure arrival process may be constructed in reference for analyzing possible system failure. For example, the repair queue trajectory may be defined, including potential system failure, and the various system parameters may be determined from working backwards from the defined repair queue trajectory. In accordance with an embodiment of the foregoing, an increasing function g(x) is defined on $\mathbb{R}$ with $g(0)=0$. Each unit interval of $\mathbb{R}$ is associated with the repair queue at some instant of time and each $z \in \mathbb{R}$ is associated with a source object according to embodiments. The real line also represents queue position. The source object associated to z+1 is the same as the source object associated to z but on the source object's previous cycle through the repair queue. Since the invariance of the content of the source object is immaterial to the repair process of embodiments, each z may be viewed for purposes herein as being associated with a distinct source object.

When the source object associated to z is at the tail of the repair queue (e.g., denote by $z_0$, then the repair queue (f(x),x) is given by $f(x)=e^{g(z)-g(z+x)}$ As time proceeds, $z_0$ decreases, wherein $s(z_0)=-g(z_0)$ so that $z_0(s)=g^{-1}(-s)$. This means that the time t at which the point z is at the tail of the repair queue is given by $s(t)=-g(z)$. This yields $$\frac{d}{ds}e^{g(z_0(s))-g(z)} = e^{g(z_0(s))-g(z)},$$

and thus $$\frac{d}{ds}\overline{f}_z(s) = -\overline{f}_z(s).$$

It should be appreciated that not all choices of g may be feasible with respect to particular embodiments. For example, some choices of g may not be consistent with the repair regulator definition implemented according to embodiments.

Define $$T(z) := \inf_{x \in [0, 1)} \phi(1 - e^{g(z)-g(x+z)}, x)$$

Then, the following may be derived from equation (18)

$$\frac{1}{g'(z_0)} = -\frac{d}{ds}z_0(s) = \frac{\hat{\lambda}(s)}{\lambda(s)} \frac{1}{T(z_0(s))}. \quad (19)$$

Assume a system failure occurs at s=s* corresponding to $z_0(s^*)=z^*$ which necessarily satisfies $-z^* \le 1$ and $g(0)-g(z^*)=s^*$. For $s \in [0,s^*]$ we have $f(-z(s))=e^{-s}$. Since $\bar{f}_T = e^{-s^*}$, from above-stated results on properties of $\phi$ it is obtained $$T(z_0(s)) \le \overline{C}(e^{-s} - e^{-s^*})^2$$

$$\le \overline{C}\left(\frac{s^*}{1 - e^{-s^*}}\right)^{-2}(s^* - s)^2$$

Thus, there is a constant C such that)

$$T(z_0(s)) \le C(g(z_0(s))-g(z_0(s^*)))^2$$

Since $g(z_0(s))-g(z_0(s^*))=\int_{z_0(s^*)}^{z_0(s)} g'(y)dy$, $$\lim\inf_{s \to s^*} \frac{T(z_0(s))}{g'(z_0(s))} = 0$$

is obtained and hence $$\lim\inf_{s \to s^*} \frac{\hat{\lambda}(s)}{\lambda(s)} = 0$$

This shows that for system failure to occur the failure arrival rate must outstrip the estimation process by an infinite ratio.

In accordance with embodiments, one more relation between $\hat{\lambda}(s)$ and $\lambda(s)$ may be obtained from the definition of the failure estimator. This, with the above, may be utilized to determine $\hat{\lambda}(s)$ and $\lambda(s)$. Further, t(s) may be determined through $$t(s) = \int_0^s \frac{1}{\lambda(u)} du.$$

In demonstrating the existence of system failing trajectories, consider $$g_a(z) = \begin{cases} 0 & z \ge 0 \\ az & z \le 0 \end{cases}$$

as a working example for the function g(z), where the constant a is to be defined. For the purposes herein, a will be chosen to be large enough so that the source object at z=0 will determine the repair rate for all $z_0 \in [-1,0]$. Although $g_a$ may be altered to be larger than 0 for positive z without affecting the analysis below, the arguments to show this have not been provided in order to simplify the discussion. To aid in understanding the following discussion, recall that the nominal repair trajectory is given by $-\ln \bar{f}(x) = \Delta T_{Target} x$, thus it may be assumed that $a \ge \Delta T_{Target} = \ln \bar{f}_{Target}$. For this example it can be shown that the self-governing bound of embodiments applies exactly (without approximation) to the source object associated to z=0.

It is shown below how, for various forms of estimators for $\hat{\lambda}$, system failure is possible. Practical failure estimators may be based on averages of storage node failure interarrival times or their inverses (e.g., the averaging can be done over windows or by some other method). Although filtering the function $\lambda$ and filtering its inverse as well as estimation based on fixed time scales and on time scales adapted to the storage node failure arrival process are considered, the following system failure analysis is restricted to estimators based on first order filtering (i.e., based on exponential windows) for simplicity. It should be appreciated that an estimation that is based on time scales adapted to the storage node failure arrival process corresponds to filtering on the adapted s time scale. Further, it should be appreciated that the derivative of $\hat{\lambda}$ may be expressed as a function of $$\frac{\hat{\lambda}}{\lambda},$$

and thus equation (19) may be immediately applied to obtain $\hat{\lambda}$. It is further useful in understanding the discussion of exemplary failure estimators which follows to note:

$$\frac{d}{ds}\hat{\lambda}(s) = \frac{\frac{d}{dt}\hat{\lambda}(t)}{\lambda(t)}$$

$$\frac{d}{ds}\ln\hat{\lambda}(s) = \frac{\frac{d}{ds}\hat{\lambda}(s)}{\hat{\lambda}(s)}.$$

Embodiments of a failure estimator may comprise a first order filter configuration. An embodiment of a first order filter configuration comprises a first order filter where $\hat{\lambda}$, given as the solution to $$\frac{d}{ds}\hat{\lambda}(t) = \beta(\lambda(t) - \hat{\lambda}(t)),$$

where $\beta > 0$ is a fixed constant, is considered. It should be appreciated that the foregoing essentially provides for determining $\hat{\lambda}$ from the number of storage node failures in the most recent time interval of length $\beta^{-1}$. Reparametrizing to s provides $$\frac{d}{ds}\hat{\lambda}(s) = \beta\left(1 - \frac{\hat{\lambda}(s)}{\lambda(s)}\right),$$

and using equation (19) gives $$\hat{\lambda}(s) = \hat{\lambda}(0) + \int_0^s \beta\left(1 - \frac{T(z_0(u))}{g'(z_0(u))}\right)du \quad (20)$$

-continued $$\hat{\lambda}(s) = \frac{\hat{\lambda}(0) + \int_0^s \beta\left(1 - \frac{T(z_0(u))}{g'(z_0(u))}\right) du}{\frac{T(z_0(s))}{g'(z_0(s))}}.$$

The previously introduced example based on $g_a$ is feasible in the foregoing, and thus represents a possible system failure. In particular, T is bounded above by $\varphi(0,0)=-\ln \bar{T}_{Target}$ and since it is assumed that $a>-\ln \bar{T}_{Target}$, it can be concluded that $$\frac{T(z_0(u))}{g'(z_0(u))} < 1.$$

Thus, $\hat{\lambda}(s)$ is increasing and bounded for $s \in [0, -\ln \bar{T}_T]$. As shown previously, $T(z_0) \le \bar{C}(e^{az_0} - \bar{J}_T T)^2$, and thus $\lambda(s) \to \infty$ as $s \to -\ln \bar{f}_T$. By the same bound it can be seen that $$t(s) = \int_0^s \frac{1}{\lambda(u)} du$$

is finite for $s \in [0, -\ln \bar{f}_T]$, and thus system failure occurs in finite time with $\hat{\lambda}$ remaining bounded. It is observed that an estimator based on a fixed time average of the inverse of storage node failure inter-arrival times is susceptible to a system failure in which storage node failures accelerate sufficiently to cause data loss while the arrival rate estimator fails to respond sufficiently quickly to the rapid increase.

Embodiments of a failure estimator comprising a first order filter configuration comprise an estimator based on the inverse of $\lambda$, i.e., $\left(\frac{1}{\lambda}\right)$ may also be considered. Such an estimator is similar to the arithmetic averaging of storage node inter-arrival times discussed previously in which the a parameter is chosen to effect a fixed time average. In accordance with embodiments, the deterministic model of this estimator may be defined by $$\frac{d}{dt}\frac{1}{\hat{\lambda}(t)} = \beta\left(\frac{1}{\lambda(t)} - \frac{1}{\hat{\lambda}(t)}\right)$$

which gives $$\frac{d}{ds}\hat{\lambda}(s) = \beta\frac{\hat{\lambda}(s)}{\lambda(s)}\left(1 - \frac{\hat{\lambda}(s)}{\lambda(s)}\right).$$

The analysis above for the non-inverted first order filter configuration may be applied, with minor adjustments, to find that $\hat{\lambda}$ is smaller in this case and so the same general system failure possibilities exist.

It should be appreciated that forming the estimate $\hat{\lambda}$ over a fixed time scale admits system failure through a sufficiently rapid increase in $\lambda$ that $\hat{\lambda}$ fails to track. Accordingly, embodiments may base the estimation window on the failure arrivals themselves. For example, an estimator may be based on the storage node failure interarrival times for some number of past storage node failures.

Embodiments of a failure estimator may comprise a failure arrival windowed filtering of $\lambda$. In accordance with an embodiment of a failure arrival windowed filtering of $\lambda$, $\lambda$ itself is averaged over a window with its width governed by a fixed number of storage node failure arrivals. A filtering form of such an estimator is provided by $$\frac{d}{ds}\hat{\lambda}(s) = \beta(\lambda(s) - \hat{\lambda}(s))$$

which can be written as $$\frac{d}{ds}\ln\hat{\lambda}(s) = \beta\left(\frac{\lambda(s)}{\hat{\lambda}(s)} - 1\right).$$

This estimator corresponds to forming an arithmetic average of the inverse of the storage node failure inter-arrival times where the average is taken over a number of failure arrivals proportional to the inverse of $\beta$. It can be seen from the above equation that for $\hat{\lambda}$ to remain bounded, $\lambda$ should be integrable. In particular, $$\int_0^s \frac{g'(z_0(u))}{T(z_0(u))}$$

should remain bounded. It turns out that this is not mathematically possible. To see this note that for some constant c, $$\int_0^s \frac{g'(z_0(u))}{T(z_0(u))} du \ge c \int_0^s \frac{g'(z_0(u))}{(g(z_0) - g(z^*))^2} du$$

$$\ge c \int_{z_0(s)}^0 \frac{(g'(z_0))^2}{(g(z_0) - g(z^*))^2} dz_0$$

But $$\int_{z_0(s)}^0 \frac{(g'(z_0))}{(g(z_0) - g(z^*))} dz_0 = \ln(g(0) - g(z^*)) - \ln(g(z_0(s)) - g(z^*))$$

which is unbounded. Thus, by averaging over a fixed number of storage node failures rather than a fixed time interval system failure cannot occur without the estimate $\hat{\lambda}$ tending to $\infty$.

For the previously introduced example based on $g_a$, $\hat{\lambda}$ is unbounded but the failure is still feasible. In particular, $\hat{\lambda}(s)$ is within a constant factor of $C(e^{az_0} - \bar{T}_T)^{-1}$ and $\lambda(s)$ blows up in accordance with $(e^{-s} - \bar{T}_T)^{-2} e^{(e^{-s} - \bar{J}_T)^{-1}}$, which is quite rapid.

Embodiments of a failure estimator may comprise a failure arrival windowed filtering of $$\frac{1}{\lambda}.$$

This corresponds to the arithmetic averaging of storage node failure inter-arrival times discussed previously. In accordance with an embodiment of a failure arrival windowed filtering of $1/\lambda$, at a given time t the time interval x for the last $\beta^{-1}n$ failures may be given as the solution to $$\beta^{-1} = \int_{t-x}^{t} \lambda(u) du$$

An estimator for $\lambda$ is $\hat{\lambda} = x^{-1}\beta$. This can also be written as $$\hat{\lambda}(t) = \left(\beta \int_0^{\beta^{-1}} \frac{1}{\lambda(t(s-u))} du\right)^{-1}.$$

A filtering based estimator of similar form is $$\hat{\lambda}(t) = \left(\beta \int_0^{\infty} e^{-\beta(s-u)} \frac{1}{\lambda(t(s-u))} du\right)^{-1}.$$

This corresponds to the differential form $$\frac{d}{ds} \frac{1}{\hat{\lambda}(s)} = \beta\left(\frac{1}{\lambda(s)} - \frac{1}{\hat{\lambda}(s)}\right)$$

which can be written as $$\frac{d}{ds} \ln \hat{\lambda}(s) = \beta\left(1 - \frac{\hat{\lambda}(s)}{\lambda(s)}\right).$$

For the previously introduced example based on $g_a$, it can be seen that $\hat{\lambda}$ remains bounded in this case.

Embodiments of a failure estimator may base the estimation window on the distance to system failure. For example, an embodiment of a failure estimator may comprise an f-adaptive windowing of $\lambda$, wherein the scale over which the estimate is made depends on the gap from f to $f_T$. As discussed above, forming the estimate $\hat{\lambda}$ over a fixed time (or storage node failure) scale may admit system failure with bounded $\hat{\lambda}$ with a sufficiently rapid increase in $\lambda$. Accordingly, embodiments may address this issue by using a time scale of the estimate that is dependent upon the source object distance to system failure. Thus, an alternate, source object dependent, form of the estimator may be given by $$\frac{d}{dt} \hat{\lambda}(t) = \frac{1}{f_T - f_0(t)} (\lambda(t) - \hat{\lambda}(t))$$

It should be appreciated that, when $f_T - f_0(t)$ is small, the time scale of the estimator is correspondingly small. Expressing this in terms of s (assuming $\tau_o = 0$) provides $$\frac{d}{ds} \hat{\lambda}(s) = \frac{1}{e^{-s} - e^{-s^*}} \left(1 - \frac{\hat{\lambda}(s)}{\lambda(s)}\right).$$

Applying the foregoing to equation (20) now takes the form $$\hat{\lambda}(s) = \hat{\lambda}(0) + \int_0^s \frac{1}{e^{-s} - e^{-s^*}} \left(1 - \frac{T(z_0(u))}{g'(z_0(u))}\right) du.$$

The integral is within a constant factor of $$\int_{z_0(s)}^0 \frac{1}{g(z) - g(z^*)} (g'(z) - T(z)) dz$$

and since $T(z) < c(g(z) - g(z^*))^2$ it can be seen that the integral is unbounded.

Forming the adapted estimate on a failure arrival time scale according to embodiments provides $$\frac{d}{ds} \hat{\lambda}(s) = \frac{1}{e^{-s} - e^{-s^*}} (\lambda(s) - \hat{\lambda}(s))$$

$$\frac{d}{ds} \ln \hat{\lambda}(s) = \frac{1}{e^{-s} - e^{-s^*}} \left(\frac{\lambda(s)}{\hat{\lambda}(s)} - 1\right)$$

In this case, system failure cannot occur without $\hat{\lambda}$ tending to $\infty$, which is the case even without the time scale adaptation.

Embodiments of a failure estimator may comprise an f-adaptive windowing of $$\frac{1}{\hat{\lambda}}.$$

An embodiment of an f-adaptive windowing of $$\frac{1}{\hat{\lambda}}$$

configuration provides $$\frac{d}{dt} \frac{1}{\hat{\lambda}(t)} = \frac{1}{f_T - f_0(t)} \left(\frac{1}{\lambda(t)} - \frac{1}{\hat{\lambda}(t)}\right)$$

which is equivalent to $$\frac{d}{ds} \hat{\lambda}(s) = \frac{1}{e^{-s} - e^{-s^*}} \frac{\hat{\lambda}(s)}{\lambda(s)} \left(1 - \frac{\hat{\lambda}(s)}{\lambda(s)}\right).$$

The previously introduced example based on $g_a$ leads to a bounded value of $\hat{\lambda}$ upon failure. If, however, the filtering is done relative to s, then $$\frac{d}{ds} \ln \hat{\lambda}(s) = \frac{1}{e^{-s} - e^{-s^*}} \left(1 - \frac{\hat{\lambda}(s)}{\lambda(s)}\right).$$

Again, it can be concluded that $\hat{\lambda}$ is necessarily unbounded. Thus an arrival rate estimator based on arithmetic averaging of storage node failure inter-arrival times that adapts the average to the distance to system failure has the property that system failure cannot occur without the estimator tending to ∞.

The preceding has examined various forms of estimators for λ to determine how the form of the estimator affects possible modes of failure. Estimates based on the arrival rate and its inverse have been examined above. Those skilled in the art will appreciate that other forms are possible, such as updating the logarithm of the failure arrival rate. It is observed that by adapting the rate of estimate update to the gap between the number of missing fragments and the threshold, it is possible to achieve greater protection against the possibility of system failure.

Figure 7:
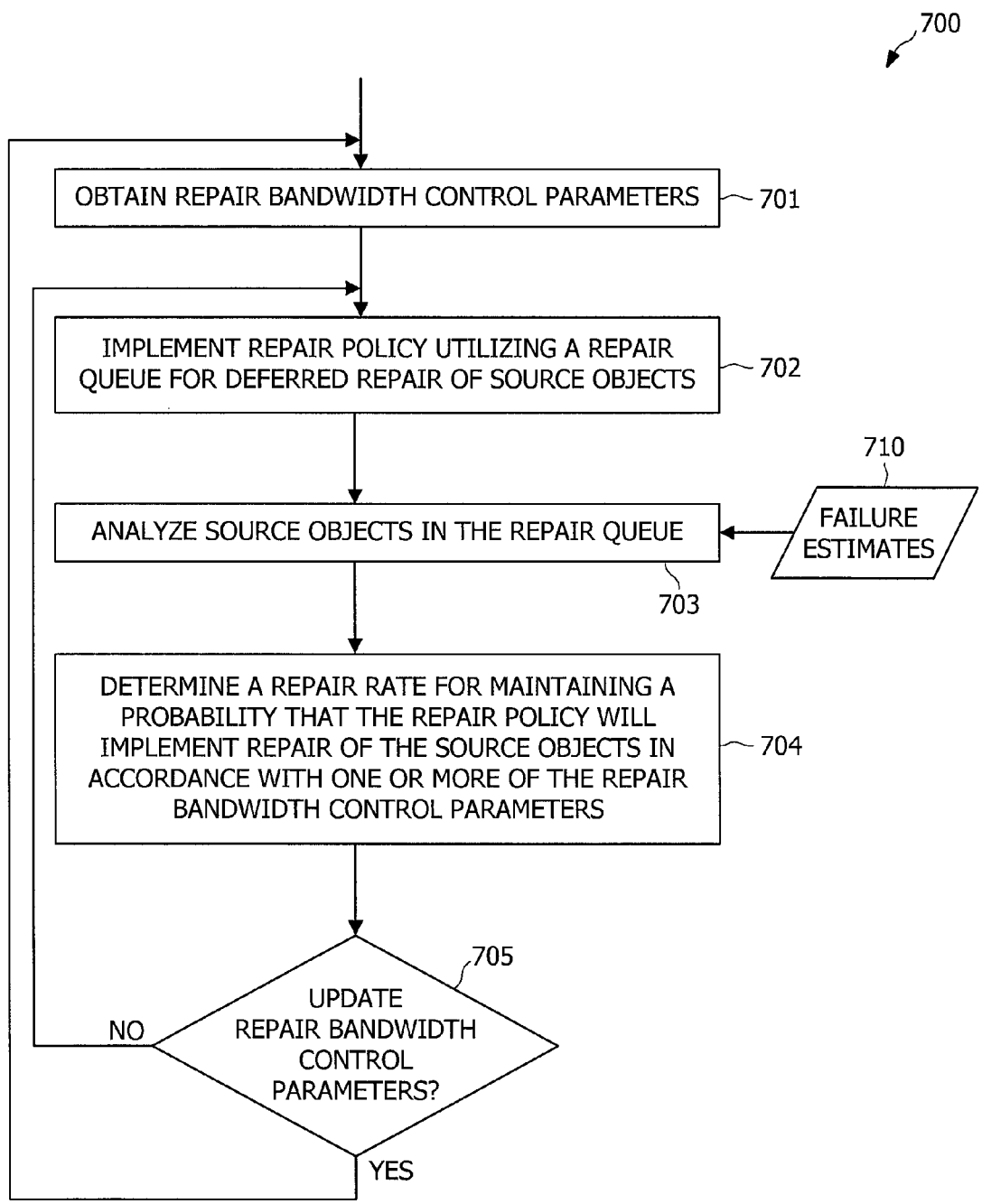
FIG. 7 shows a high level flow diagram of operation for controlling a source object repair rate in a storage system according to embodiments of the present disclosure.

Having described various embodiments implementing repair bandwidth control techniques by providing a feedback control structure for regulating repair bandwidth in the storage system, exemplary operation of a process as may be implemented according to one or more such embodiments will be discussed with reference to FIG. 7. In particular, FIG. 7 provides a high level flow diagram of operation for controlling a source object repair rate in a storage system according to embodiments herein.

In flow 700 of the illustrated embodiment one or more repair bandwidth control parameters are obtained at block 701. For example, repair bandwidth control parameters may be selected for provisioning and/or updating operation of the repair policy to ensure recovery of source data stored by the source objects in the storage system and to provide a desired level of repair efficiency in the storage system, whereby the selected repair bandwidth control parameters are obtained by repair bandwidth control logic for use in implementing operation according to the concepts herein. The repair bandwidth control parameters utilized according to embodiments may include a fragment loss threshold ($f_T$), a target number of fragments ($f_{Target}$), and/or a predicted storage node failure rate (λ). The repair bandwidth control parameters may additionally or alternatively include a repair bandwidth or repair rate metric (R), such as may be used in initially implementing a repair policy, to provide a minimum and/or maximum repair rate to be implemented by the repair policy, to provide a default repair rate, etc. The repair bandwidth control parameters may be input (e.g., to repair bandwidth control logic 253) by a system administrator, a system operator, a user, etc. Additionally or alternatively, one or more repair bandwidth control parameters (e.g., an initial repair bandwidth, a fragment loss threshold, and/or predicted storage node failure rate) may be determined or otherwise derived (e.g., by lazy repair policy 252 and/or repair bandwidth control logic 253), such as using one or more parameters of the storage system (e.g., parameters of one or more functional blocks of large erasure code storage control logic 250).

At block 702 of the illustrated embodiment, a repair policy is implemented (e.g., by lazy repair policy logic 252) in accordance with at least one of the repair bandwidth control parameters. For example, a repair queue (e.g., repair queue 253) may contain a representation of source objects in the storage system ordered by their set of available fragments, whereby the repair policy operates to cycle through the source object instances in the repair queue, read in an appropriate number of fragments to recover a source object in need of repair, and generate and store additional fragments for the source object on one or more replacement storage nodes in accordance with at least one of the repair bandwidth control parameters (e.g., at a repair rate of the repair bandwidth control parameters, in accordance with one or more thresholds of the repair bandwidth control parameters, etc.).

Repair bandwidth control logic operates to analyze source objects in the repair queue for implementing repair bandwidth control according to the concepts herein at block 703 of the illustrated embodiment. For example, repair bandwidth control logic (e.g., repair regulator logic 256) may analyze the source object positions in the repair queue, the number of missing/available fragments for respective source objects in the repair queue, the proximity of one or more source objects to fragment loss having an unacceptably high probability of data loss, one or more fragment loss/storage node failure rates, etc. The analysis of source objects in the repair queue may include analysis of all source objects in the repair queue or some subset thereof according to embodiments. For example, the analysis, or some portion thereof, may be skipped with respect to some source objects in light of the monotonicity properties of the policy implying that only certain "critical" source objects can determine the repair rate.

Fragment loss rates and/or storage node failure rates utilized according to embodiments may be estimated. For example, failure estimator logic 257 may operate to determine a storage system storage node failure rate and/or a per source object fragment loss/storage node failure rate and provide such estimates to repair regulator logic 256 (e.g., at block 710) for use in source object analysis.

In operation according to embodiments, the repair regulator logic provides a per source object repair rate determination (e.g., a repair rate preference for each source object or some subset thereof). The repair rate determined for each respective source object (i.e., the per source object repair rates) may be based upon information unique to the state of the source object (e.g., the source object's position in the repair queue, the source object fragments missing/available in the storage system, the per source object fragment loss/storage node failure rate estimate, the proximity of the source object to fragment loss having an unacceptably high probability of data loss, and/or the like). Additionally, the repair rate determined for each respective source object may be based upon one or more repair bandwidth control parameters (e.g., the fragment loss threshold, the target number of fragments, the predicted storage node failure rate, the minimum/maximum/default repair bandwidth or repair rate metric, and/or the like). The repair rate determined for the source objects according to embodiments is a repair rate suitable for maintaining a probability that the corresponding source object will be repaired in accordance with one or more of the repair bandwidth control parameters (e.g., at a repair rate of the repair bandwidth control parameters, in accordance with one or more thresholds of the repair bandwidth control parameters, etc.). For example, the repair rate determined for the source objects may provide a per source object repair rate that ensures the corresponding source object is repaired prior to its loss of fragments meeting the fragment loss threshold but when its loss of fragments meets (or nearly meets) the target number of fragments.

At block 704 of the illustrated embodiment, a repair rate for maintaining a probability that the repair policy will implement repair of the source objects in accordance with one or more of the repair bandwidth control parameters is determined. For example, a repair rate of the per source object repair rates (e.g., a maximum repair rate of the per source object repair rates) may be selected as the repair rate to be used by the storage system repair policy (e.g., lazy repair policy 252). It should be appreciated that, because each of the per source object repair rates of embodiments is adapted for maintaining a probability that the corresponding source object will be repaired in accordance with one or more of the repair bandwidth control parameters, appropriate selection of one such repair rate facilitates maintaining a probability that the repair policy will implement repair of the source objects in accordance with one or more of the repair bandwidth control parameters by the repair policy.

Having determined the repair rate for use by the storage system repair policy, operation according to embodiments thus controls the repair policy to implement the repair rate. For example, repair bandwidth control 253 of embodiments provides control with respect to lazy repair policy 252 to implement repair of source objects in repair queue 254 in accordance with the selected repair rate.

It should be appreciated, however, that in addition to the dynamic adjustment of repair policy repair rates, embodiments may further operate to update one or more of the repair bandwidth control parameters. For example, the target number of missing fragments may be adjusted in response to a determination that the probability of a desired MTTDL is being achieved is insufficient (e.g., forward looking decoding analysis with respect to the source objects may show an unacceptable probability of data loss within a MTTDL period). Accordingly, the illustrated embodiment of flow 700 includes block 705 wherein a determination is made regarding whether one or more parameters of the repair bandwidth control parameters is to be updated. If it is determined that no parameter of the repair bandwidth control parameters is to currently be updated (i.e., block 705="No"), processing according to the illustrated embodiment returns to block 702 wherein the repair rate determined at block 704 is implemented by the repair policy. However, if it is determined that one or more parameters of the repair bandwidth control parameters is to currently be updated (i.e., block 705="Yes"), processing according to the illustrated embodiment returns to block 701 where the updated repair bandwidth control parameter(s) is obtained.

Processing according to flow 700 of embodiments may recursively be performed to provide adaptive repair rate control according to embodiments. For example, the analyzing of source objects and determining a repair rate may be performed periodically, upon the occurrence of an event, etc., whereby the repair policy may implement an updated repair rate in accordance with the repair rate determined by the repair bandwidth control logic.

As can be appreciated from the foregoing, repair bandwidth control comprising feedback control that dynamically determines repair rates, such as based on a source object repair queue and storage node failure rate estimates, may provide a number of advantageous characteristics. For example, in operation of repair bandwidth control according to embodiments, the entire repair queue state factors into repair rate selection. Repair rate selection is provided according to embodiments by maximizing over per source object determined rate preferences in which a desired minimum repair rate is determined for each object, or for a set of critical objects, in the repair queue. The per object repair rate preferences of embodiments are a function of source object position in the repair queue and number of failed fragments at that position. In operation of embodiments, storage node failure arrival rate estimates are maintained and used to modulate repair rate preferences and/or decisions. The repair rate preferences of embodiments are a function of source object position in the repair queue, number of failed fragments at that position, and an estimate of storage node failure arrival rate (which may depend on position and number of failed fragments). Storage node failure arrival rate estimates are based on windows of past failures in which the window used for a position in the repair queue varies with the number of failed fragments at that position according to embodiments herein. The window size utilized according to embodiments decreases as the number of failed fragments increases.

It should be appreciated that the concepts herein may be applied to dynamic adjustment of one or more storage system operating parameters in addition to or in the alternative to repair bandwidth control. For example, the redundancy provided by the erasure coding implemented by a storage system may be adjusted using a feedback control structure of embodiments, in addition to or instead of the repair rate. In operation of one such embodiment, if the storage node failure rate increases then instead of reacting by increasing the repair rate, erasure code storage control logic may operate to cause more redundant fragments for each source object to be generated and stored during repair. For example, additional storage nodes can be added to the storage system (to increase the number of available storage nodes) in reaction to a measured increase in the storage node failure rate, and fragments may be generated and stored on these storage nodes during repair (e.g., keeping the same number k of source fragments as before while storing additional repair fragments, r). In accordance with some embodiments, if there is spare capacity on the storage nodes, the overhead (redundancy) for source objects can be increased in reaction to a measured increase in the storage node failure rate by storing multiple fragments on the storage nodes during repair, such as to store two fragments of a source object per storage node during repair instead of storing one fragment per storage node during repair. Such an embodiment has the net effect of increasing the redundancy without adding additional storage nodes to the storage system.

Either or both of the foregoing techniques can be used in conjunction with adjusting the repair bandwidth as described herein. For example, it may be the case that the storage node failure rate spikes up for some period of time, and thus the repair rate may correspondingly spike up in operation according to embodiments. As an additional response, the redundancy of the storage system may be increased (e.g., using one or more of the foregoing techniques), and thus the repair rate may eventually be decreased again due to the additional overhead redundancy introduced. Such an implementation allows reduction of the repair rate and provides bandwidth headroom to react to future additional spikes in the storage node failure rate by increasing the repair rate. Thus, in an implementation according to embodiments, operation to adjust the repair rate (e.g., as described in accordance with embodiments above) may be the primary and first response to changes in storage node failure rate (e.g., where changes in repair rate are still smooth as possible while maintaining an excellent MTTDL). However, a secondary response (e.g., if the increased storage node failure rate persists and if the response repair bandwidth to the increased storage node failure rate is relatively high) may be utilized to increase the redundancy (overhead) of source objects during repair, thus eventually allowing a lowering of the repair rate to a more sustainable level.

Figure 8:
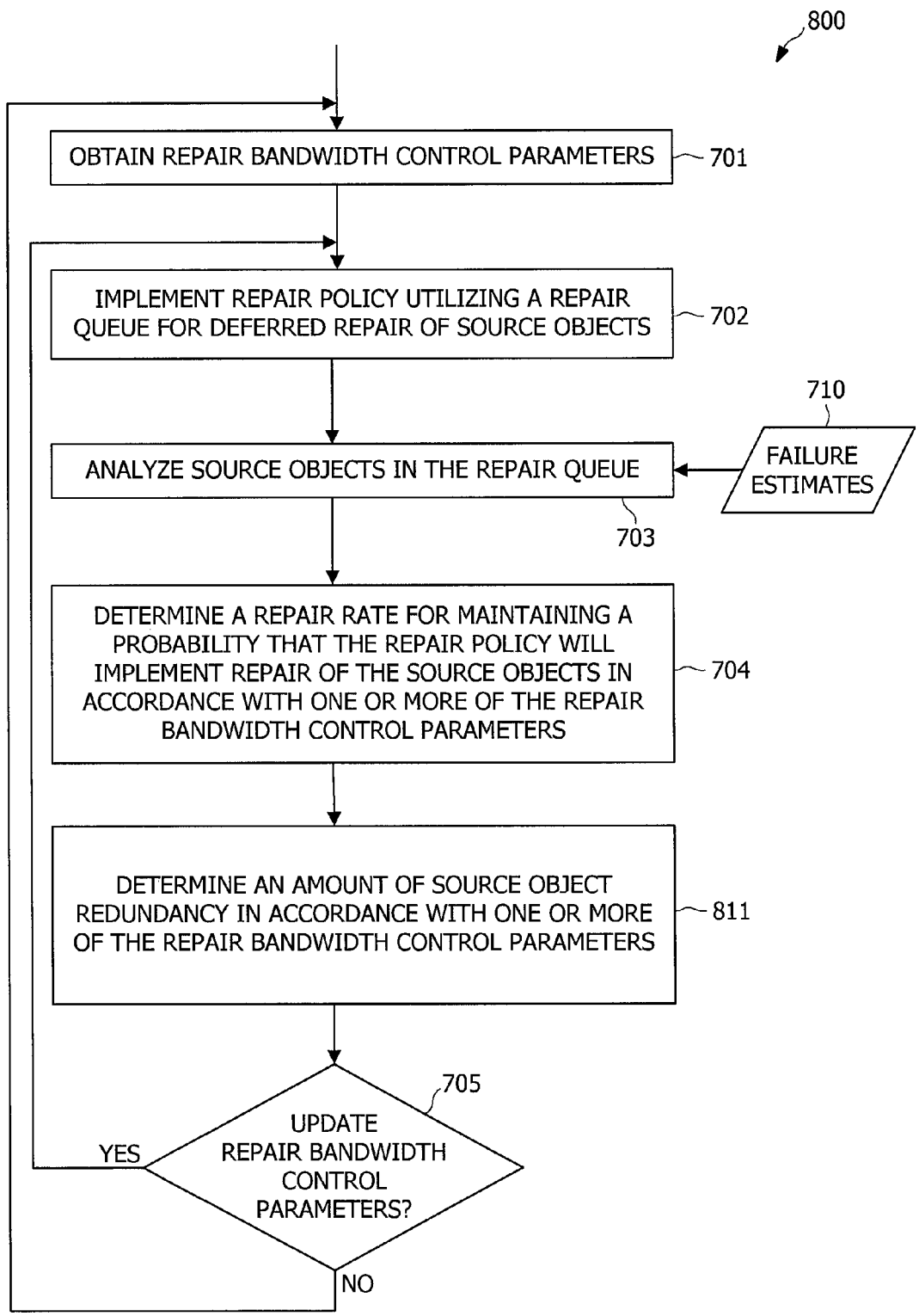
FIG. 8 shows a high level flow diagram of operation for implementing repair of source objects according to embodiments of the present disclosure.

In further detail, FIG. 8 provides a high level flow diagram of operation for implementing repair of source objects according to embodiments of the present disclosure. Flow 800 in FIG. 8 may include blocks 701-710, which may provide the functionality of blocks 701-710 in FIG. 7 and which may also provide additional functionality. For example, FIG. 8 may include block 811 in which an amount of source object redundancy in accordance with one or more control parameters (such as, the repair bandwidth control parameters) is determined; and the implementation of the repair policy in block 702 of FIG. 8 may include generating fragments in accordance with the determined amount of source object redundancy. In an embodiment, determining the amount of source object redundancy in block 811 may include determining a number of repair fragments for the source objects. In an embodiment, determining the amount of source object redundancy in block 811 may include determining a number of fragments for a source object of the source objects to be stored on storage nodes of the storage system. It will be appreciated that, in some embodiments of flow 800, block 811 may be optional and/or block 704 may be optional, and thus, flow 800 may include block 704, block 811, or both blocks 704 and 811. Moreover, because control parameters (e.g., the repair bandwidth control parameters) may be dynamically updated (e.g., via blocks 705 and 701), the repair rate, the amount of redundancy, or both may be adjusted dynamically.

In an embodiment such as those described above where both the repair rate and the amount of redundancy may be adjusted dynamically, the number of fragments n generated and stored for source objects may vary over time, and thus different source objects may have different associated values of n, and also may use different corresponding values of the threshold $f_T$ and the target $f_{Target}$ when determining a per source object repair rate. For example, the initial value of n used for all source objects might be 2500 (wherein k is for example 2000), but at some point the repair process (e.g., based on embodiments described herein) may increase the repair rate (e.g., in reaction to an increase in the node loss rate) above a threshold value, which in turn may trigger the repair process to use a new value 3000 of n when repairing source objects thereafter. In this example, there may be some source objects with an associated value of n equal to 2500, whereas there may be other source objects with an associated value of n equal to 3000. A variant of the embodiments described above, wherein per object preferred repair rates are determined for different source objects, follows. Given a number k of fragments for each source object in a set of objects, repair bandwidth control provided according to embodiments implements repair regulator logic (e.g., repair regulator logic 256 of FIG. 2B) operable to ensure that source objects in the aforementioned repair queue are repaired at a time that the number of available fragments for any object is not less than a threshold value $k+a_T$, wherein $a_T$ is a value that may depend on k. Additionally, $k+a_{Target}$ may represent a target number of available fragments for a source object at the time the source object is repaired, wherein $a_{Target} \geq a_T$ is selected so as to ensure recovery of source data and to provide a desired level of repair efficiency.

Suppose, for example, a source object has n stored fragments after the most recent repair of the source object, or after the source object was initially added to the storage system if the source object has not been repaired since it was added. The function $\Phi$ used in computing an object preferred repair rate in embodiments above could be immediately updated when computing the preferred repair rate for an object for which the value of n has changed. This update could also involve an adjustment in the values of other regulator parameters, such as $f_T$, $f_{Target}$, and n, which are implicit parameters of the function $\Phi$. For example, it may be desirable to keep the number of available fragments for any object above an invariant threshold value $k+a_T$, where $a_T$ may be determined based in part on k, and thus the used value of $f_T$ may be $1-(k+a_T)/n$ when computing the preferred repair rate for an object with associated value n, while keeping $a_T$ fixed and k fixed. Similarly, $k+a_{Target}$ may represent a target number of available fragments for a source object at the time the source object is repaired, where $a_{Target}$ may be $1-(k+a_{Target})/n$ when computing the preferred repair rate for an object which associated value n, while keeping $a_{Target}$ fixed and k fixed. Hereafter, $\Phi_n$ refers to the function $\Phi$ as just described wherein n is an explicit input parameter to $\Phi$. Other adjustments may involve changing the threshold $f_T$ and/or target $f_{Target}$ in other ways. For example it may be desirable to use the increased n to reduce variation in repair bandwidth. In this case $a_{Target}$ might be increased. In other embodiments it might be desirable to increase the number of redundant fragments available for access. In this case $a_T$ might be increased. To avoid possible abrupt reaction in the switch from one regulator policy to another the switch could be make gradually. For example, the system may update the policy applied to an object only upon the next repair of that object. In the above example scenario, there may be some source objects with an associated value of n equal to 2500, whereas there may be other source objects with an associated value of n equal to 3000. There would be a plurality of choices for the function $\Phi_{2500}$ and $\Phi_{3000}$, perhaps determined by keeping $a_T$ and $a_{Target}$ fixed and varying n. Then, from some point in time forward objects are switched from the $\Phi_{2500}$ to the $\Phi_{3000}$ request policy. This could be done, for example, upon the next repair of that object.

Embodiments may likewise operate to respond in the reverse, such as to reduce the redundancy of source objects stored in the storage system (e.g. if the storage node failure rate drops or if the repair rate is well below a reasonable repair rate), such as by using a larger k value when repairing source objects or reducing the number of available storage nodes for the source objects, thus reducing the redundancy (overhead) for storing source objects in the long run and eventually leading to raising the repair rate.

There are many variants of the above embodiments. For example, the parameters of a modified version of the function $\Phi$ can comprise an object position J and a number of fragments M, wherein J indicates that there are J–1 other objects in the repair queue positioned to be repaired before the object is repaired, and thus J objects in total are repaired before the object is repaired, and wherein M is the number of available fragments for the object at the time when the object is in position J. In this variant, threshold $a_T$ and target $a_{Target}$ as described above can be used to determine how $\Phi$ is computed. In this variant, for a source object in position J with M available fragments a repair time of $\lambda^{-1} \cdot \Phi(M,J)$ is preferred, where $\lambda$, is the single node loss rate. It should be appreciated that, if the repair regulator logic process permanently selects the foregoing repair time, then the respective source object will be repaired after time $J \cdot (\lambda^{-1} \cdot \Phi(M,J))$. Under a Poisson model the distribution of the number of available fragments upon repair is determined by M, $\lambda$, and the foregoing repair time. Thus, $\Phi$ reflects the preferred properties of this distribution. Repair bandwidth control of embodiments may operate to choose the repair time for the repair regulator logic process as the minimum of the preferred repair times:

$$\min_{J \in \lfloor 1 : \circlearrowright \rfloor} \lambda^{-1} \Phi(M(J), J)$$

where M(J) denotes the number of erased fragments for the object in position J. Variants that take into account variable size source objects and dynamically changing node failure rates and the like, as described in embodiments above, can also be adopted Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, implemented by processor-based logic of a storage system in which source objects are stored as a plurality of erasure coded fragments, for controlling a source object repair rate in the storage system, the method comprising:
    analyzing a plurality of source objects represented in a repair queue to determine repair rate information for source objects of the plurality of source objects;
    determining a first repair rate based on the repair rate information for the source objects of the plurality of source objects to provide a determined level of recovery of source data stored by the plurality of source objects and to provide a determined level of repair efficiency in the storage system; and
    implementing repair of one or more source objects of the plurality of source objects in accordance with the first repair rate.

2. The method of claim 1, wherein the determining a first repair rate comprises:
    determining, based on the repair rate information, a repair rate for at least two source objects of the plurality of source objects to provide a plurality of per source object repair rates; and
    selecting as the first repair rate a maximum of the plurality of per source object repair rates.

3. The method of claim 2, wherein the repair rate information for the source objects comprises a storage node failure rate metric and a missing fragment metric.

4. The method of claim 3, wherein the missing fragment metric comprises a relative position in the repair queue of a representation of a respective source object of the plurality of source objects.

5. The method of claim 3, wherein the storage node failure rate metric is a storage node failure rate for the storage system, and wherein a same system storage node failure rate is used as the storage node failure rate for the source objects of the plurality of source objects.

6. The method of claim 3, wherein the storage node failure rate metric is a per source object storage node failure rate, and wherein a respective per source object storage node failure rate is used as the storage node failure rate for the source objects of the plurality of source objects.

7. The method of claim 3, wherein the repair rate information for the source objects further comprises a target fraction of a total number of fragments ($f_{Target}$), wherein the first repair rate provides repair of a source object when a number of missing fragments for the source object reaches $f_{Target} \cdot n$, wherein n is a total number of fragments for the source object.

8. The method of claim 3, wherein the repair rate information for the source objects further comprises a lower threshold value ($a_L$), wherein the first repair rate provides repair of a source object after at least $a_L$ fragments are missing for the source object.

9. The method of claim 3, wherein the repair rate information for the source objects further comprises an upper threshold value ($a_U$), wherein the first repair rate provides repair of a source object before $a_U$ fragments are missing for the source object.

10. The method of claim 3, further comprising:
    estimating the storage node failure rate metric based at least in part on one or more aspects of the repair queue.

11. The method of claim 10, wherein the estimating the storage node failure rate metric comprises:
    determining a per source object number of erased fragments.

12. The method of claim 11, wherein the determining a per source object storage node failure rate comprises
    adjusting a failure arrival window used for analyzing past storage node failures based at least in part on the number of erased fragments of the respective source object.

13. The method of claim 11, wherein the determining a per source object storage node failure rate comprises:
    applying a filtering operation to past storage node failures interarrival times for the source objects of the plurality of source objects.

14. The method of claim 1, wherein the repair queue contains a representation of the plurality of source objects ordered for repair by a repair policy of the storage system, wherein source objects having a representation near a head of the repair queue have more missing fragments associated therewith than source objects having a representation near a tail of the repair queue.

15. The method of claim 14, wherein the plurality of source objects represented in the repair queue and analyzed to determine the repair rate information comprise an ordered subset of source objects represented in the repair queue beginning at the head of the repair queue.

16. The method of claim 14, wherein the plurality of source objects represented in the repair queue and analyzed to determine the repair rate information comprise all source objects stored in the storage system.

17. The method of claim 1, further comprising:
    obtaining a fragment loss threshold ($f_T \cdot n$) and a target number of fragments ($f_{Target} \cdot n$), wherein the fragment loss threshold is a number of fragments selected to prevent loss of source data stored in the storage system with a high probability, and wherein the target number of fragments is a number of fragments selected to facilitate repair efficiency in operation of a repair policy performing repair of source objects of the plurality of source objects.

18. The method of claim 17, wherein the determining a first repair rate based on the repair rate information for the source objects of the plurality of source objects is adapted to cause the repair policy to perform repairs on a trajectory directed toward $f_{Target} \cdot n$ missing fragments while preventing a number of missing fragments for any source object of the plurality of source objects to exceed $f_T \cdot n$.

19. The method of claim 1, wherein the determining a first repair rate is further based on a total amount of source data that is stored by the storage system.

20. An apparatus for controlling a source object repair rate in a storage system, the apparatus comprising:
one or more data processors; and
one or more non-transitory computer-readable storage media containing program code configured to cause the one or more data processors to perform operations including:
analyzing a plurality of source objects represented in a repair queue to determine repair rate information for source objects of the plurality of source objects;
determining a first repair rate based on the repair rate information for the source objects of the plurality of source objects to provide a determined level of recovery of source data stored by the plurality of source objects and to provide a determined level of repair efficiency in the storage system; and
implementing repair of one or more source objects of the plurality of source objects in accordance with the first repair rate.

21. The apparatus of claim 20, wherein the determining a first repair rate comprises:
determining, based on the repair rate information, a repair rate for at least two source objects of the plurality of source objects to provide a plurality of per source object repair rates; and
selecting as the first repair rate a maximum of the plurality of per source object repair rates.

22. The apparatus of claim 21, wherein the repair rate information for the source objects comprises a storage node failure rate metric and a missing fragment metric.

23. The apparatus of claim 22, wherein the missing fragment metric comprises a relative position in the repair queue of a representation of a respective source object of the plurality of source objects.

24. The apparatus of claim 22, wherein the storage node failure rate metric is a storage node failure rate for the storage system, and wherein a same system storage node failure rate is used as the storage node failure rate for the source objects of the plurality of source objects.

25. The apparatus of claim 22, wherein the storage node failure rate metric is a per source object storage node failure rate, and wherein a respective per source object storage node failure rate is used as the storage node failure rate for the source objects of the plurality of source objects.

26. The apparatus of claim 22, wherein the repair rate information for the source objects further comprises a target fraction of a total number of fragments ($f_{Target}$), wherein the first repair rate provides repair of a source object when a number of missing fragments for the source object reaches $f_{Target} \cdot n$, wherein n is a total number of fragments for the source object.

27. The apparatus of claim 22, wherein the repair rate information for the source objects further comprises a lower threshold value ($a_L$), wherein the first repair rate provides repair of a source object after at least $a_L$ fragments are missing for the source object.

28. The apparatus of claim 22, wherein the repair rate information for the source objects further comprises an upper threshold value ($a_U$), wherein the first repair rate provides repair of a source object before $a_U$ fragments are missing for the source object.

29. The apparatus of claim 22, wherein the operations performed by the one or more data processors further includes:
estimating the storage node failure rate metric based at least in part on one or more aspects of the repair queue.

30. The apparatus of claim 29, wherein the estimating the storage node failure rate metric comprises:
determining a per source object number of erased fragments.

31. The apparatus of claim 30, wherein the determining a per source object storage node failure rate comprises:
adjusting a failure arrival window used for analyzing past storage node failures based at least in part on the number of erased fragments of the respective source object.

32. The apparatus of claim 30, wherein the determining a per source object storage node failure rate comprises:
applying a filtering operation to past storage node failure arrival times for the source objects of the plurality of source objects.

33. The apparatus of claim 20, wherein the repair queue contains a representation of the plurality of source objects ordered for repair by a repair policy of the storage system, wherein source objects represented at a head of the repair queue have more missing fragments associated therewith than source objects represented at a tail of the repair queue.

34. The apparatus of claim 33, wherein the plurality of source objects represented in the repair queue and analyzed to determine the repair rate information comprise an order subset of source objects represented in the repair queue beginning at the head of the repair queue.

35. The apparatus of claim 33, wherein the plurality of source objects represented in the repair queue and analyzed to determine the repair rate information comprise all source objects stored in the storage system.

36. The apparatus of claim 20, wherein the operations performed by the one or more data processors further includes:
obtaining a fragment loss threshold ($f_T \cdot n$) and a target number of fragments ($f_{Target} \cdot n$), wherein the fragment loss threshold is a number of fragments selected to prevent loss of source data stored in the storage system with a high probability, and wherein the target number of fragments is a number of fragments selected to facilitate repair efficiency in operation of a repair policy performing repair of source objects of the plurality of source objects.

37. The apparatus of claim 36, wherein the determining a first repair rate based on the repair rate information for the source objects of the plurality of source objects is adapted to cause the repair policy to perform repairs on a trajectory directed toward $f_{Target} \cdot n$ missing fragments while preventing a number of missing fragments for any source object of the plurality of source objects to exceed $f_T \cdot n$.

38. The apparatus of claim 20, wherein the determining a first repair rate is further based on a total amount of source data that is stored by the storage system.

39. An apparatus for controlling a source object repair rate in a storage system, the apparatus comprising:
means for analyzing a plurality of source objects represented in a repair queue to determine repair rate information for the source objects of the plurality of source objects;
means for determining a first repair rate based on the repair rate information for source objects of the plurality of source objects to provide a determined level of recovery of source data stored by the plurality of source objects and to provide a determined level of repair efficiency in the storage system; and means for implementing repair of one or more source objects of the plurality of source objects in accordance with the first repair rate.

40. The apparatus of claim 39, wherein the means for determining a first repair rate comprises:

means for determining, based on the repair rate information, a repair rate for at least two source objects of the plurality of source objects to provide a plurality of per source object repair rates; and means for selecting as the first repair rate a maximum of the plurality of per source object repair rates.

41. The apparatus of claim 40, wherein the repair rate information for the source objects comprises a storage node failure rate metric and a missing fragment metric.

42. The apparatus of claim 41, wherein the storage node failure rate metric is a per source object storage node failure rate, and wherein a respective per source object storage node failure rate is used as the storage node failure rate for the source objects of the plurality of source objects.

43. The apparatus of claim 41, wherein the repair rate information for the source objects further comprises a target fraction of a total number of fragments ($f_{Target}$), wherein the first repair rate provides repair of a source object when a number of missing fragments for the source object reaches $f_{Target} \cdot n$, wherein n is a total number of fragments for the source object.

44. The apparatus of claim 41, wherein the repair rate information for the source objects further comprises a lower threshold value ($a_L$), wherein the first repair rate provides repair of a source object after at least $a_L$ fragments are missing for the source object.

45. The apparatus of claim 41, wherein the repair rate information for the source objects further comprises an upper threshold value ($a_U$), wherein the first repair rate provides repair of a source object before $a_U$ fragments are missing for the source object.

46. The apparatus of claim 41, further comprising:

means for estimating the storage node failure rate metric based at least in part on one or more aspects of the repair queue.

47. The apparatus of claim 46, wherein the means for estimating the storage node failure rate metric comprises:

means for determining a per source object number of erased fragments.

48. The apparatus of claim 47, wherein the means for determining a per source object storage node failure rate comprises:

means for adjusting a failure arrival window used for analyzing past storage node failures based at least in part on the number of erased fragments of the respective source object.

49. The apparatus of claim 47, wherein the means for determining a per source object storage node failure rate comprises:

means for applying a filtering operation to past storage node failure interarrival times for the source objects of the plurality of source objects.

50. The apparatus of claim 39, further comprising:

means for obtaining a fragment loss threshold ($f_T \cdot n$) and a target number of fragments ($f_{Target} \cdot n$), wherein the fragment loss threshold is a number of fragments selected to prevent loss of source data stored in the storage system with a high probability, and wherein the target number of fragments is a number of fragments selected to facilitate repair efficiency in operation of a repair policy performing repair of source objects of the plurality of source objects.

51. The apparatus of claim 39, wherein the means for determining a first repair rate further bases the first repair rate on a total amount of source data that is stored by the storage system.

52. A non-transitory computer-readable medium comprising codes for controlling a source object repair rate in a storage system, the codes causing a computer to:

analyze a plurality of source objects represented in a repair queue to determine repair rate information for source objects of the plurality of source objects;

determine a first repair rate based on the repair rate information for the source objects of the plurality of source objects to provide a determined level of recovery of source data stored by the plurality of source objects and to provide a determined level of repair efficiency in the storage system; and implement repair of one or more source objects of the plurality of source objects in accordance with the first repair rate.

53. The non-transitory computer-readable medium of claim 52, wherein the codes causing the computer to determine a first repair rate causes the computer to:

determine, based on the repair rate information, a repair rate for at least two source objects of the plurality of source objects to provide a plurality of per source object repair rates; and select as the first repair rate a maximum of the plurality of per source object repair rates.

54. The non-transitory computer-readable medium of claim 53, wherein the repair rate information for the source objects comprises a storage node failure rate metric and a missing fragment metric.

55. The non-transitory computer-readable medium of claim 54, wherein the storage node failure rate metric is a per source object storage node failure rate, and wherein a respective per source object storage node failure rate is used as the storage node failure rate for the source objects of the plurality of source objects.

56. The non-transitory computer-readable medium of claim 54, wherein the repair rate information for the source objects further comprises a target fraction of a total number of fragments ($f_{Target}$), wherein the first repair rate provides repair of a source object when a number of missing fragments for the source object reaches $f_{Target} \cdot n$, wherein n is a total number of fragments for the source object.

57. The non-transitory computer-readable medium of claim 54, wherein the repair rate information for the source objects further comprises a lower threshold value ($a_L$), wherein the first repair rate provides repair of a source object after at least $a_L$ fragments are missing for the source object.

58. The non-transitory computer-readable medium of claim 54, wherein the repair rate information for the source objects further comprises an upper threshold value ($a_U$), wherein the first repair rate provides repair of a source object before $a_U$ fragments are missing for the source object.

59. The non-transitory computer-readable medium of claim 54, wherein the codes further cause the computer to:

estimate the storage node failure rate metric based at least in part on one or more aspects of the repair queue.

60. The non-transitory computer-readable medium of claim 59, wherein the codes causing the computer to estimate the storage node failure rate metric causes the computer to:

determine a per source object number of erased fragments.

61. The non-transitory computer-readable medium of claim 52, wherein the codes causing the computer to determine a first repair rate further causes the computer to determine the first repair rate based on a total amount of source data that is stored by the storage system.

\* \* \* \* \*